(12) United States Patent
Abe et al.

(10) Patent No.: US 10,712,620 B2
(45) Date of Patent: Jul. 14, 2020

(54) METHOD OF MANUFACTURING LIQUID CRYSTAL DEVICE, LIQUID CRYSTAL DEVICE, AND ELECTRONIC APPARATUS

(71) Applicant: SEIKO EPSON CORPORATION, Tokyo (JP)

(72) Inventors: Hiroyuki Abe, Matsumoto (JP); Yoshio Taniguchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 55 days.

(21) Appl. No.: 15/987,096

(22) Filed: May 23, 2018

(65) Prior Publication Data
US 2018/0348581 A1 Dec. 6, 2018

(30) Foreign Application Priority Data
May 30, 2017 (JP) ................. 2017-106271

(51) Int. Cl.
| | | |
|---|---|---|
| G02F 1/1343 | (2006.01) | |
| G02F 1/1337 | (2006.01) | |
| G02F 1/1362 | (2006.01) | |
| G02F 1/1368 | (2006.01) | |
| H01L 27/12 | (2006.01) | |
| G09G 3/36 | (2006.01) | |
| G02F 1/137 | (2006.01) | |

(Continued)

(52) U.S. Cl.
CPC ........ *G02F 1/134309* (2013.01); *G02F 1/137* (2013.01); *G02F 1/1337* (2013.01); *G02F 1/1339* (2013.01); *G02F 1/1368* (2013.01); *G02F 1/133788* (2013.01); *G02F 1/136286* (2013.01); *G09G 3/3655* (2013.01); *G09G 3/3674* (2013.01); *G09G 3/3685* (2013.01); *H01L 27/124* (2013.01); *H01L 27/1262* (2013.01); *G02F 2001/13712* (2013.01); *G02F 2001/133357* (2013.01); *G02F 2001/133749* (2013.01); *G02F 2201/123* (2013.01)

(58) Field of Classification Search
CPC ......... G02F 1/134309; G02F 1/133788; G02F 2001/133357; G02F 1/136286; G02F 1/137; G02F 1/1339; G02F 1/1337; G02F 2001/13712; G02F 2001/133749; G02F 2201/123; H01L 27/124; H01L 27/1262; G09G 3/3674; G09G 3/3655; G09G 3/3685
USPC ........................................................ 349/139
See application file for complete search history.

(56) References Cited

U.S. PATENT DOCUMENTS
2007/0002235 A1 1/2007 Tanaka et al.

FOREIGN PATENT DOCUMENTS
| | | |
|---|---|---|
| JP | 2006-030843 A | 2/2006 |
| JP | 2007-011226 A | 1/2007 |

(Continued)

*Primary Examiner* — Nathanael R Briggs
*Assistant Examiner* — William D Peterson
(74) *Attorney, Agent, or Firm* — Oliff PLC

(57) ABSTRACT

A method of manufacturing a liquid crystal device according to the invention includes forming an inorganic alignment film on a side of an element substrate that faces the liquid crystal layer and on a side of a counter substrate that faces the liquid crystal layer, forming an hydrophobic film that covers the inorganic alignment film, and removing at least a portion of the hydrophobic film that is formed outside a pixel region of the element substrate and the counter substrate when viewed in plan view.

20 Claims, 11 Drawing Sheets

(51) Int. Cl.
    *G02F 1/1339*    (2006.01)
    *G02F 1/1333*    (2006.01)

(56)          References Cited

FOREIGN PATENT DOCUMENTS

| | | |
|---|---|---|
| JP | 2011-221115 A | 11/2011 |
| JP | 2014-102366 A | 6/2014 |
| JP | 2014-202887 A | 10/2014 |
| JP | 2016-017984 A | 2/2016 |
| JP | 2016017984 A * | 2/2016 |

* cited by examiner $\tan\theta' = h/r$
CONTACT ANGLE $\theta = 2\theta'$

METHOD OF MANUFACTURING LIQUID CRYSTAL DEVICE, LIQUID CRYSTAL DEVICE, AND ELECTRONIC APPARATUS

BACKGROUND

1. Technical Field

The present invention relates to a method of manufacturing a liquid crystal device, a liquid crystal device, and an electronic apparatus.

2. Related Art

A liquid crystal device includes a liquid crystal layer interposed between a pair of substrates. The liquid crystal layer is formed, for example, of nematic liquid crystal molecules having positive or negative dielectric anisotropy. Alignment of the liquid crystal molecules in the liquid crystal layer is controlled by an alignment film formed on each of the pair of substrates in accordance with the optical design of the liquid crystal device. Examples of an alignment film that causes nematic liquid crystal molecules to be in a desired alignment state include an organic alignment film made of polyimide resin or the like and an inorganic alignment film made of silicon oxide or the like. The inorganic alignment film is superior to the organic alignment film in terms of heat resistance and light resistance. However, the liquid crystal molecules are known to undergo photochemical reactions with hydroxyl groups on the surface of the inorganic alignment film, which may negatively affect the alignment of the liquid crystal molecules.

For example, JP-A-2007-11226 discloses a method of manufacturing an electrooptic device that includes forming an alignment film from an inorganic material on at least one of a first substrate and a second substrate, the alignment film controlling an alignment state of an electrooptic material, fixing an organic compound to a surface of the alignment film that faces the electrooptic material by reacting the organic compound with the alignment film, and adhering the first substrate to the second substrate. Alcohols, silane compounds, and fatty acids are exemplified as the organic compound in the disclosure.

According to the method of manufacturing an electrooptic device disclosed in JP-A-2007-11226, by fixing an organic compound, by way of reaction, to an alignment film made of an inorganic material, in other words, to an inorganic alignment film, the reactivity on the surface of the inorganic alignment film is reduced and, as a result, photochemical reactions between the inorganic alignment film and liquid crystal molecules are suppressed or eliminated.

In addition, for example, JP-A-2006-30843 discloses a liquid crystal device in which an alignment layer capable of aligning liquid crystal molecules is disposed on the surface of at least one of a pair of substrates that faces a liquid crystal layer. The alignment layer includes a main body having a plurality of holes and a hydrophobic layer that has hydrophobicity. The hydrophobic layer enables at least a portion of the surface of the main body to align liquid crystal molecules. By covering the main body having a plurality of holes with the hydrophobic layer, the main body can be prevented from absorbing water and reactions between pixel electrodes and liquid crystal molecules can be suppressed or eliminated.

According to JP-A-2006-30843, the main body of the alignment layer is formed of an insulating material, such as $SiO_2$ or $Al_2O_3$. In other words, the main body is an inorganic alignment film formed of an inorganic material. The hydrophobic layer that covers the main body is constituted by a compound containing a long-chain alkyl group of a carbon number of approximately C5 to C20. According to this disclosure, such a hydrophobic layer can be obtained by subjecting the main body to coupling treatment by using, for example, n-decyltriethoxysilane, which is a silane compound.

As suggested by JP-A-2007-11226 and JP-A-2006-30843, the surface of an inorganic alignment film may exhibit hydrophobicity by subjecting the inorganic alignment film to surface treatment by using alcohols or silane compounds. If a chemical vapor deposition method, such as oblique vapor deposition, is used as the method of forming an inorganic alignment film, the inorganic alignment film is formed over the entire surface of a substrate. In other words, if the surface of the inorganic alignment film is treated with an alcohol or a silane compound, hydrophobicity is imparted to the entire surface of the substrate.

As a result, for example, even if an adhesive, such as a sealant, and a conductive member, which is used for establishing an electrical connection between circuits, are disposed appropriately at predetermined positions on the surface of the substrate to which hydrophobicity has been imparted, the sealant and the conductive member may be repelled by the surface and, as a result, deviate from the intended positions or be deformed, and adhesion between these members and the substrate may deteriorate.

SUMMARY

An advantage of some aspects of the invention is that the following forms or application examples can be implemented.

Application Example

According to an application example, a method of manufacturing a liquid crystal device, which includes an element substrate, a counter substrate, and a liquid crystal layer interposed between the element substrate and the counter substrate, includes forming an inorganic alignment film on a side of the element substrate that faces the liquid crystal layer and on a side of the counter substrate that faces the liquid crystal layer; forming a hydrophobic film that covers the inorganic alignment film; and, in at least one of the element substrate and the counter substrate, removing at least a portion of the hydrophobic film that is formed outside a pixel region in which a plurality of pixel electrodes are disposed when viewed in plan view.

According to this application example, in the step of removing, at least a portion of the formed hydrophobic film is removed from a region that is located outside the pixel region and that corresponds to a structure to be disposed later on at least one of the element substrate and the counter substrate. In other words, the method of manufacturing the liquid crystal device in which a structure can be disposed at a desired position on at least one of the substrates without being influenced by the hydrophobic film can be provided.

In the method of manufacturing the liquid crystal device according to the above application example, it is preferable that the counter substrate have a counter electrode that is disposed so as to oppose the plurality of the pixel electrodes via the liquid crystal layer, that the element substrate have a connection portion at a position outside the pixel region, the connection portion being electrically connected to the counter electrode via a conductive member, and that in the step of removing, the hydrophobic film on a portion that overlaps the connection portion when viewed in plan view be removed from the element substrate and the counter substrate. According to this method, the conductive member can be disposed at a desired position in the connection portion without being influenced by the hydrophobic film so that the connection portion and the counter electrode can be electrically connected reliably to each other via the conductive member.

In the method of manufacturing the liquid crystal device according to the above application example, it is preferable that the element substrate and the counter substrate be adhered to each other via a sealant that is disposed outside the pixel region, and that in the step of removing, the hydrophobic film on a portion that overlaps the sealant when viewed in plan view be removed from the element substrate and from the counter substrate. According to this method, the sealant can be disposed at a desired position without being influenced by the hydrophobic film so that the element substrate and the counter substrate can be adhered securely to each other via the sealant.

In the method of manufacturing the liquid crystal device according to the above application example, it is preferable that the element substrate have a plurality of external connection terminals disposed outside the pixel region, and that in the step of removing, the hydrophobic film on a portion that overlaps a region including the external connection terminals when viewed in plan view be removed. According to this method, the conductive member can be disposed at a predetermined position on the external connection terminals without being influenced by the hydrophobic film so that the external connection terminals can be electrically connected reliably to, for example, a wiring substrate for connection with an external circuit via the conductive member.

In the method of manufacturing the liquid crystal device according to the above application example, it is preferable that the counter substrate have a counter electrode that is disposed so as to oppose the plurality of the pixel electrodes via the liquid crystal layer, that the element substrate have a connection portion and a plurality of external connection terminals at positions outside the pixel region, the connection portion being electrically connected to the counter electrode via a conductive member, that the element substrate and the counter substrate be adhered to each other via a sealant that is disposed outside the pixel region, and that in the step of removing, portions of the hydrophobic film that overlap respective regions that include the connection portion, the sealant, and the plurality of the external connection terminals when viewed in plan view be removed. According to this method, the conductive member can be disposed at a desired position in the connection portion without being influenced by the hydrophobic film so that the connection portion and the counter electrode can be electrically connected reliably to each other via the conductive member. In addition, the sealant can be disposed at a desired position, and the element substrate and the counter substrate can be reliably adhered to each other via the sealant. Moreover, the conductive member can be disposed at a desired position on the external connection terminals so that the external connection terminals can be electrically connected reliably to, for example, a wiring substrate for connection with an external circuit via the conductive member.

In the method of manufacturing the liquid crystal device according to the above application example, it is preferable that in the step of forming the hydrophobic film, the hydrophobic film be formed by exposing each of the element substrate and the counter substrate on both of which the inorganic alignment film has been formed to an atmosphere containing a silane compound having a hydrophobic group. According to this method, the hydrophobic film is formed by exposing the substrate to an atmosphere containing a silane compound having a hydrophobic group. Compared with such methods as vacuum evaporation, sputtering, and application of a liquid-phase silane compound, this method is advantageous in film-coating properties in that a uniform hydrophobic film can be formed even if the surface of the inorganic alignment film has irregularities.

In the method of manufacturing the liquid crystal device according to the above application example, it is preferable that in the step of removing, the hydrophobic film be removed in such a manner that at least the pixel region of at least one of the element substrate and the counter substrate is masked and the hydrophobic film is irradiated with ultraviolet rays in an atmosphere containing oxygen. According to this method, irradiation with ultraviolet rays in an atmosphere containing oxygen activates oxygen to generate ozone, which can decompose and remove the hydrophobic film. In addition, compared with a case of removal, for example, by using a photoresist to cover the portions of the hydrophobic film that are not removed and by performing oxygen plasma treatment, the hydrophobic film can be removed selectively by using a simpler method.

In the method of manufacturing the liquid crystal device according to the above application example, it is preferable that the element substrate include a pixel circuit that performs switching control of each of the plurality of the pixel electrodes and a peripheral circuit that drives the pixel circuit, and that in the step of removing, a region in which the peripheral circuit is disposed when viewed in plan view be masked and irradiated with ultraviolet rays. According to this method, semiconductor elements that constitutes the pixel circuit and the peripheral circuit are not irradiated with ultraviolet rays, which can prevent the semiconductor elements from deteriorating in their properties under ultraviolet irradiation.

In the method of manufacturing the liquid crystal device according to the above application example, it is preferable that in the step of forming the hydrophobic film, the hydrophobic film be formed in such a manner that the hydrophobic film has a water contact angle of 40 degrees or more when measured in accordance with a static method, and that in the step of removing, the hydrophobic film be irradiated with ultraviolet rays in such a manner that a surface from which the hydrophobic film has been removed has a water contact angle of 30 degrees or less when measured in accordance with the static method. According to this method, the degree of hydrophobic film formation and the degree of hydrophobic film removal can be determined appropriately by measuring the water contact angle.

In the method of manufacturing the liquid crystal device according to the above application example, at least the element substrate, of the element substrate and the counter substrate, may be manufactured from a mother substrate in such a manner that a plurality of element substrates are arranged on the mother substrate, and at least the removing may be carried out by using the mother substrate. According to this method, the step of removing can be carried out efficiently by using the mother substrate.

Application Example

A liquid crystal device according to another application example is manufactured by employing the method of manufacturing the liquid crystal device according to the application example described above. According to this application example, required structures are disposed at desired positions on any of the element substrate and the counter substrate. Thus, a liquid crystal device with high reliability can be provided.

Application Example

An electronic apparatus according to still another application example includes the liquid crystal device according to the above application example. According to this application example, an electronic apparatus equipped with a liquid crystal device having high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
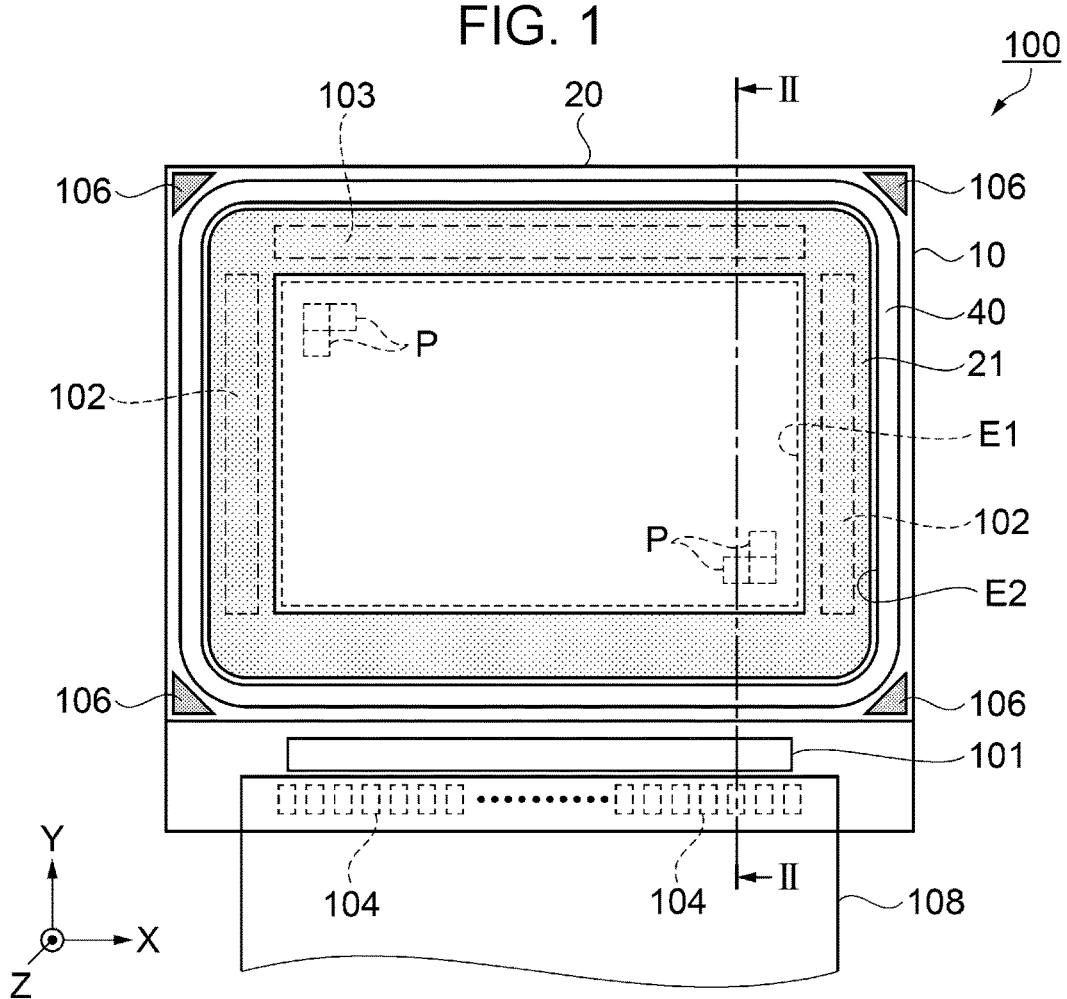
FIG. 1 is a plan view schematically illustrating a structure of a liquid crystal device.

Exemplary embodiments in which the invention is implemented will be described with reference to the accompanying drawings. Note that in the drawings, portions to be described may be scaled up or down so as to make such portions more recognizable.

In the embodiments, an active-driving type liquid crystal device having thin film transistors (TFT) as switching elements for pixels will be described by way of example. The liquid crystal device can be preferably used, for example, as a light modulator (liquid crystal light valve) for a projection-type display apparatus (liquid crystal projector), which will be described later.

First Embodiment

Liquid Crystal Device

Figure 2:
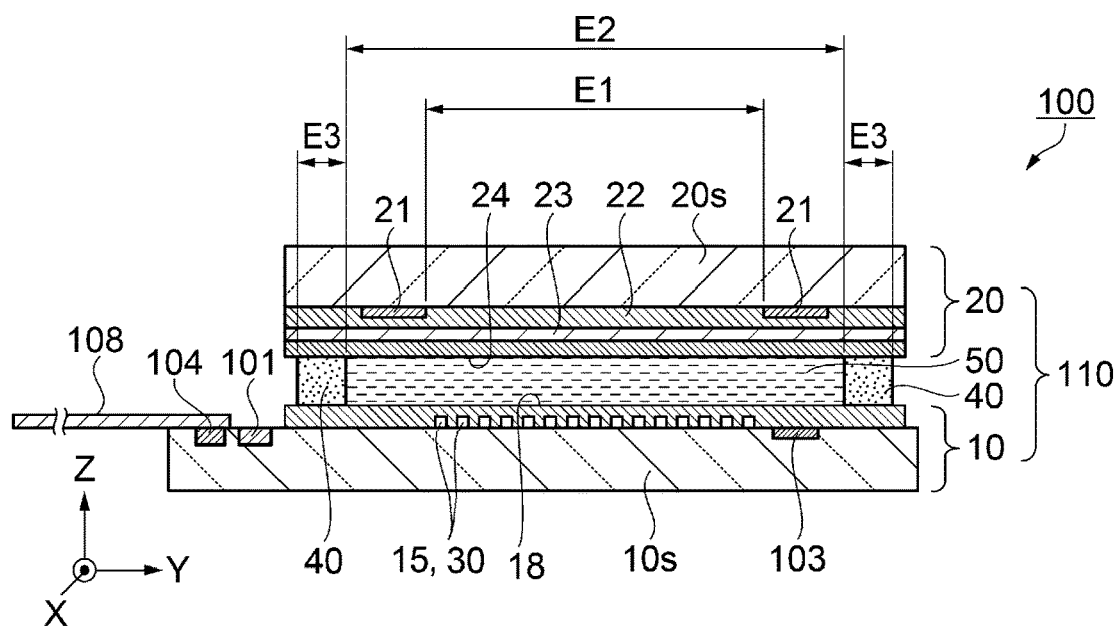
FIG. 2 is a cross-sectional view taken along line II-II in FIG. 1, which schematically illustrates a structure of the liquid crystal device.
Figure 3:
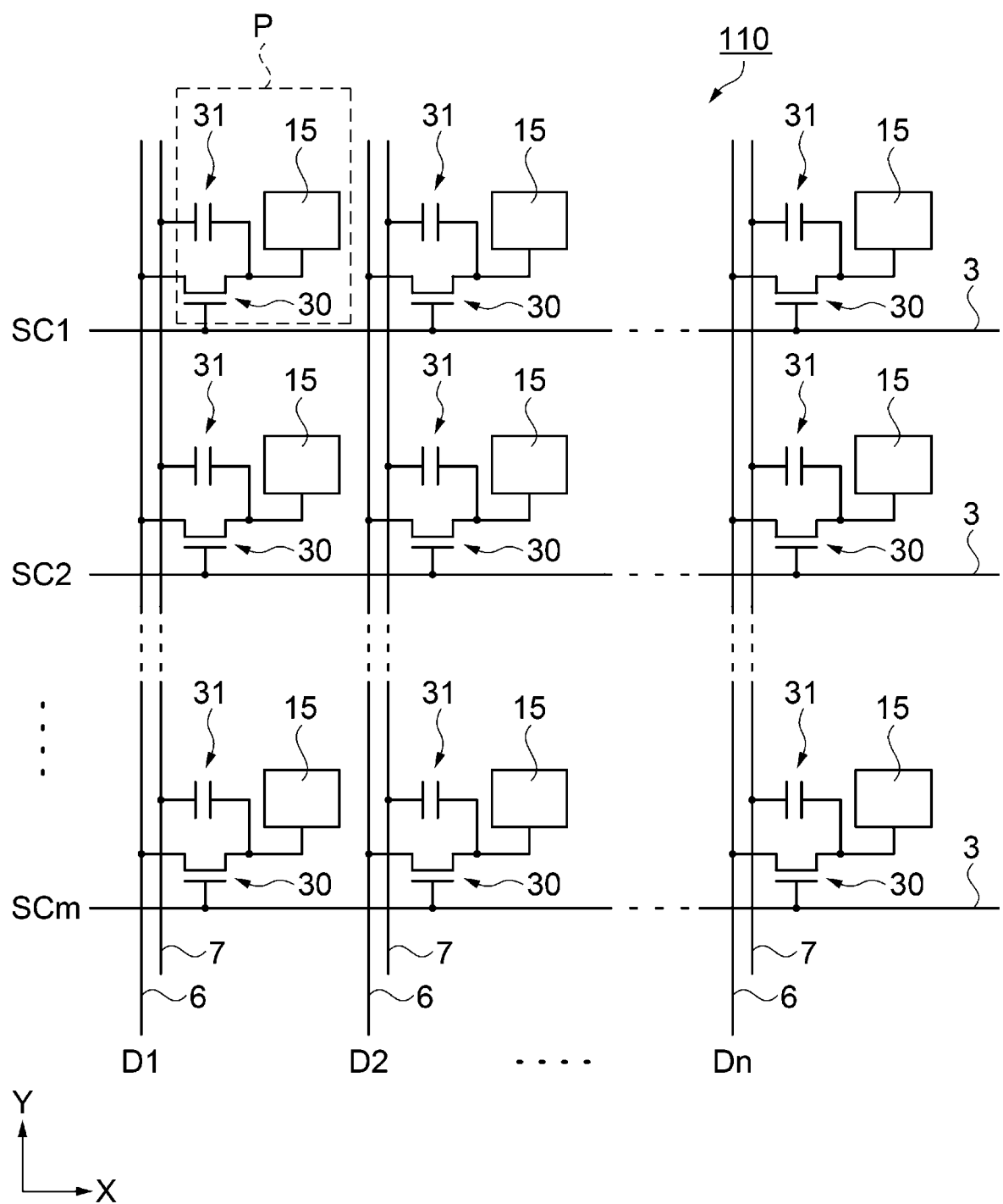
FIG. 3 is a view of an equivalent circuit illustrating an electrical configuration of the liquid crystal device.

The main structure of a liquid crystal device according to the present embodiment will be described with reference to FIG. 1 to FIG. 3. FIG. 1 is a plan view schematically illustrating a structure of the liquid crystal device. FIG. 2 is a cross-sectional view taken along line II-II in FIG. 1, which schematically illustrates a structure of the liquid crystal device. FIG. 3 is a view of an equivalent circuit illustrating an electrical configuration of the liquid crystal device.

As illustrated in FIG. 1 and FIG. 2, a liquid crystal device 100 includes a liquid crystal panel 110. The liquid crystal panel 110 further includes a pair of an element substrate 10 and a counter substrate 20 which are disposed so as to face each other and also includes a liquid crystal layer 50 interposed between the pair of substrates. A base substrate 10s of the element substrate 10 and a base substrate 20s of the counter substrate 20 are made of, for example, a quartz substrate or a glass substrate, either of which is transparent.

The element substrate 10 and the counter substrate 20 are adhered to each other via a sealant 40 that is disposed along the periphery of the counter substrate 20. Liquid crystal is injected into the area surrounded by the sealant 40 that is disposed like a picture frame, thereby forming the liquid crystal layer 50. Regarding the method of injecting liquid crystal, for example, a one drop fill (ODF) method may be adopted, in which liquid crystal is dropped onto the area surrounded by the sealant 40 that is disposed like a picture frame, and the element substrate 10 and the counter substrate 20 are pasted together under a depressurized environment. For example, an adhesive, such as a heat-curable or a UV-curable epoxy resin, can be utilized as the sealant 40. Spacers (not illustrated) for retaining a constant distance between a pair of opposing substrates are mixed in the sealant 40.

A pixel region E1 that includes a plurality of pixels P arranged in a matrix is provided in the area surrounded by the sealant 40. The pixel region E1 may include a plurality of dummy pixels in addition to the pixels P that contribute to displaying. The dummy pixels are disposed in an area along the periphery of the pixel region E1.

An edge section 21 is provided between the sealant 40 and the pixel region E1 so as to surround the pixel region E1. The edge section 21 is formed, for example, of a metal or a metal oxide that has a light-blocking property.

The element substrate 10 has a terminal section that protrudes in one direction from the counter substrate 20 when the element substrate 10 is adhered to the counter substrate 20. A plurality of external connection terminals 104 are arrayed on the terminal section. A data line driving circuit 101 is provided between the sealant 40 and a first side of the liquid crystal panel 110 that extends along the terminal section. A test circuit 103 is also disposed between the sealant 40 and the pixel region E1 along a second side of the liquid crystal panel 110 that is opposite to the first side.

Moreover, scanning line driving circuits 102 are respectively disposed between the sealant 40 and the pixel region E1 along the third and fourth sides of the liquid crystal panel 110 that orthogonally intersect the first side and are located opposite to each other. A plurality of electric wires (not illustrated) that couple the two of the scanning line driving circuits 102 together are disposed between the sealant 40 and the test circuit 103 along the second side.

These electric wires (not illustrated), which are connected to the data line driving circuit 101 and to the scanning line driving circuit 102, are connected to the plurality of the external connection terminals 104 that are arrayed along the first side. A flexible printed circuit 108 (FPC 108) is mounted on the terminal section in which the external connection terminals 104 are disposed. Various control signals, including data to be displayed, are provided to the external connection terminals 104 via the FPC 108 from an external circuit that drives the liquid crystal device 100. Note that the arrangement of the test circuit 103 is not limited to that described. The test circuit 103 may be disposed between the data line driving circuit 101 and the pixel region E1 along the inside edge of the sealant 40.

Also note that the X direction hereinafter denotes a direction parallel to the first side and the Y direction denotes a direction parallel to the third side. The Z direction denotes a thickness direction of the liquid crystal panel 110, which orthogonally intersects the X direction and the Y direction. In addition, the expressions "an object viewed in plan view" and "an object in plan view" mean that the object is viewed in the Z direction from above the counter substrate 20.

As illustrated in FIG. 2, a pixel electrode 15 that is light transmissive, a thin film transistor 30 (hereinafter referred to as "TFT 30") that serves as a switching element, signal wiring, and an alignment film 18 that covers these components are formed for each pixel P on the surface of the element substrate 10 that faces the liquid crystal layer 50. Thus, the element substrate 10 includes the base substrate 10s and, on the base substrate 10s, the pixel electrodes 15, the TFTs 30, the signal wiring, and the alignment film 18.

The counter substrate 20, which is disposed so as to oppose the element substrate 10, includes the base substrate 20s. On the base substrate 20s, the counter substrate 20 further includes the edge section 21, a planarizing layer 22 that is formed to cover the edge section 21, a counter electrode 23 that covers the planarizing layer 22, and an alignment film 24 that covers the counter electrode 23. The counter electrode 23 functions as a common electrode that is disposed so as to cover substantially the entire surface of the base substrate 20s.

In the embodiment, a region that is surrounded by the sealant 40 and that includes the pixel region E1 is called "sealant-surrounded region E2". The sealant 40 is disposed between the periphery of the sealant-surrounded region E2 and the corresponding side edges of the counter substrate 20. The region in which the sealant 40 is disposed is called "sealing region E3". The sealant 40 is ejected onto the element substrate 10, for example, by using a dispenser and is subsequently pressed while the counter substrate 20 is placed onto the element substrate 10 with pressure. Thus, the sealant 40 is preferably disposed inside the sealing region E3. However, there may be a case in which a portion of the sealant 40 may be pushed out of the sealing region E3.

As illustrated in FIG. 2, the edge section 21 is located within the sealant-surrounded region E2 and surrounds the pixel region E1. When viewed in plan view, the edge section 21 is provided at a position overlapping the scanning line driving circuits 102 and the test circuit 103. As a result, light incident on these peripheral circuits from the counter substrate 20 side is blocked, and the peripheral circuits are prevented from malfunctioning due to the light. In addition, the edge section 21 prevents unnecessary stray light from being incident on the pixel region E1, thereby contributing to a high display contrast of the pixel region E1. In the embodiment, as described above, the sealant 40 is formed of a UV-curable epoxy resin. Accordingly, the edge section 21 is disposed so as not to overlap the sealant 40 when viewed in plan view. There is a small gap between outside edges of the edge section 21 and corresponding inside edges of the sealing region E3. The gap is provided taking into account the UV-curable properties of the sealant 40 and the registration accuracy between the element substrate 10 and the counter substrate 20 when these substrates are adhered to each other via sealant 40. When a heat-curable adhesive is used as the sealant 40, it is not necessary to provide such a gap. The sealant 40 will be described in detail later.

The planarizing layer 22 is made of an inorganic material such as silicon oxide and has light transmissivity. The planarizing layer 22 is disposed so as to cover the edge section 21. The planarizing layer 22 is formed, for example, by using a plasma CVD method.

The counter electrode 23 is formed of a transparent conductive film that is made of, for example, indium tin oxide (ITO). The counter electrode 23 covers the planarizing layer 22 and is electrically connected to vertical conduction sections 106 that are disposed at the respective four corners of the counter substrate 20 as illustrated in FIG. 1. The vertical conduction sections 106 are electrically connected to the wiring of the element substrate 10. The vertical conduction sections 106 will be described in detail later.

The alignment film 18, which covers the pixel electrode 15, and the alignment film 24, which covers the counter electrode 23, are selected in accordance with the optical design of the liquid crystal device 100. An inorganic material, such as silicon oxide (SiOx), is used to form inorganic alignment films for the alignment films 18 and 24 by employing, for example, a deposition method, such as oblique vapor deposition or sputtering. The inorganic alignment films cause nematic liquid crystal molecules with negative dielectric anisotropy to align substantially vertically.

The liquid crystal panel 110 is a transmissive type liquid crystal panel in which an optical design with a normally white mode or a normally black mode is adopted. The normally white mode is a mode in which the transmissivity of a pixel P is maximum when voltage is not being applied, whereas the normally black mode is a mode in which the transmissivity of a pixel P is minimum when voltage is not being applied. In accordance with the optical design, polarizing elements are respectively disposed on the incident side and the outgoing side of the liquid crystal panel 110 including the element substrate 10 and the counter substrate 20. In an example of the liquid crystal panel 110 according to the present embodiment, as described herein, the alignment films 18 and 24 are inorganic alignment films, and the liquid crystal has negative dielectric anisotropy. In addition, the optical design is based on the normally black mode.

Next, an electrical configuration of the liquid crystal panel 110 in the liquid crystal device 100 will be described with reference to FIG. 3. The liquid crystal panel 110 has a plurality of scanning lines 3, data lines 6, and capacitor lines 7. The scanning lines 3 and the data lines 6 form signal wiring, and the scanning lines 3 are insulated from, and orthogonally intersect, respective ones of the data lines 6 at least in the pixel region E1. The capacitor lines 7 are disposed parallel to respective ones of the data lines 6. The scanning lines 3 extend in the X direction, while the data lines 6 extend in the Y direction.

The pixel electrode 15, the TFT 30, and a storage capacitor 31 are disposed in each of the regions partitioned by these signal lines such as the scanning lines 3, the data lines 6, and the capacitor lines 7. These components form a pixel circuit for controlling switching of the pixel electrode 15 of a pixel P.

The scanning line 3 is electrically connected to the gate of the TFT 30 and the data line 6 is electrically connected to the source of the TFT 30. The pixel electrode 15 is electrically connected to the drain of the TFT 30.

The data lines 6 are connected to the data line driving circuit 101 (see FIG. 1). The data line driving circuit 101 supplies image signals D1, D2, . . . , Dn to the pixels P via corresponding one of the data lines 6. The scanning lines 3 are connected to the scanning line driving circuits 102 (see FIG. 1). The scanning line driving circuits 102 supply scanning signals SC1, SC2, . . . , SCm to the pixels P via corresponding one of the scanning lines 3.

The data line driving circuit 101 may supply the image signals D1 to Dn to the data lines 6 sequentially line after line in this order or may supply the image signals D1 to Dn per data line group, in which data line groups are formed of adjacent multiple ones of the data lines 6. The scanning line driving circuits 102 supply the scanning signals SC1 to SCm to the scanning lines 3 sequentially line after line. The scanning signals are supplied as pulses with a predetermined timing.

The liquid crystal panel 110 is configured such that when the TFT 30 receives one of the scanning signals SC1 to SCm, the TFT 30 as a switching element assumes an "on" state for a certain amount of time, and thereby one of the image signals D1 to Dn supplied by the data lines 6 is written in the corresponding pixel electrode 15 at a predetermined timing. Consequently, the image signals D1 to Dn of a predetermined level are written in the liquid crystal layer 50 via the pixel electrodes 15 and retained for a certain amount of time between the pixel electrodes 15 and the counter electrode 23 that faces the pixel electrodes 15 with the liquid crystal layer 50 therebetween. The frequency used for the image signals D1 to Dn is, for example, 60 Hz.

The storage capacitor 31 is connected across each liquid crystal capacitor that is formed between each of the pixel electrodes 15 and the counter electrode 23 so as to prevent leakage of a corresponding one of retained image signals D1 to Dn. The storage capacitor 31 is provided between the drain of the TFT 30 and the capacitor line 7.

The data lines 6 are connected to the test circuit 103 illustrated in FIG. 1, which is used to check the image signals and detect a malfunction in the liquid crystal panel 110 during manufacturing of the liquid crystal panel 110. However, this function is not illustrated in the equivalent circuit in FIG. 3.

The peripheral circuits according to the embodiment that drive and control the pixel circuits include the data line driving circuit 101, the scanning line driving circuits 102, and the test circuit 103. The peripheral circuits may also include a sampling circuit, which samples the image signals and supplies the sampled image signals to the data lines 6, and a precharge circuit, which supplies the data lines 6 with respective precharge signals of a predetermined voltage level before supplying the image signals.

Figure 4:
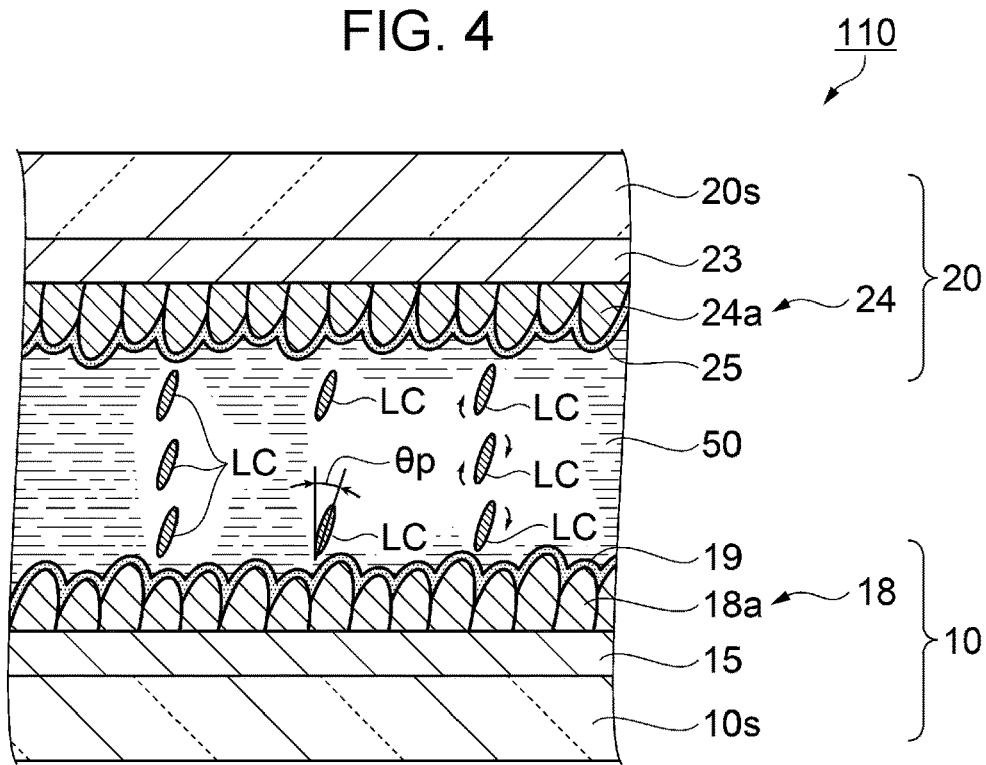
FIG. 4 is a cross-sectional view schematically illustrating alignment films and an alignment state of liquid crystal molecules in a pixel of a liquid crystal panel.
Figure 5:
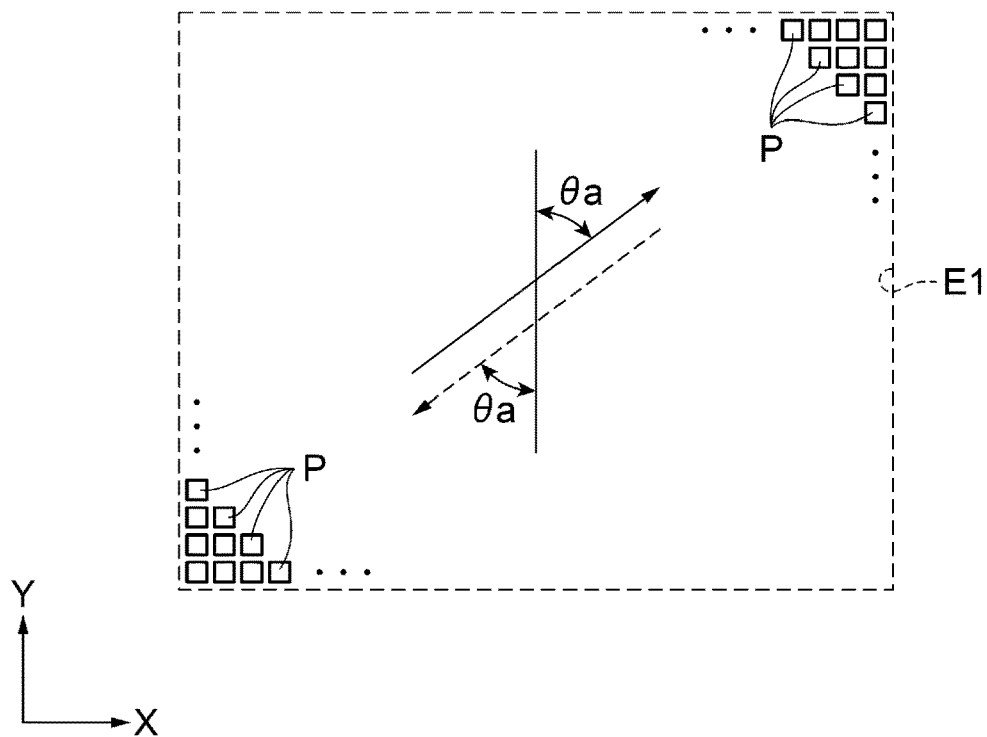
FIG. 5 is a plan view schematically illustrating alignment control directions for liquid crystal molecules in the liquid crystal panel.

Next, the alignment films 18, 24 and alignment states of liquid crystal molecules having negative dielectric anisotropy in the liquid crystal panel 110 will be described with reference to FIG. 4 and FIG. 5. FIG. 4 is a cross-sectional view schematically illustrating alignment films and an alignment state of liquid crystal molecules in a pixel of the liquid crystal panel, and FIG. 5 is a plan view schematically illustrating alignment control directions for liquid crystal molecules in the liquid crystal panel. Note that in FIG. 4, the pixel electrode 15, the counter electrode 23, and the alignment films 18, 24 are illustrated, whereas other components of the element substrate 10 and the counter substrate 20 are not illustrated. Also note that in FIG. 5, alignment control directions of liquid crystal molecules are indicated for the case of being viewed from above the counter substrate 20.

As illustrated in FIG. 4, the alignment film 18 is formed so as to cover the surface of the pixel electrode 15 of the element substrate 10 that faces the liquid crystal layer 50. The alignment film 18 according to the embodiment is an aggregate of columns 18a. The columns 18a are formed by depositing silicon oxide ($SiO_2$) as an inorganic material obliquely with respect to the normal to the base substrate 10s, and thus, evaporated silicon oxide molecules deposit obliquely in each column 18a. In addition, the surface of the alignment film 18 (the columns 18a) is covered with a hydrophobic film 19.

The alignment film 24 is formed so as to cover the surface of the counter electrode 23 of the counter substrate 20 that faces the liquid crystal layer 50. As is the alignment film 18, the alignment film 24 is also an aggregate of columns 24a that are formed by depositing silicon oxide ($SiO_2$) as an inorganic material obliquely with respect to the normal to the base substrate 20s. The surface of the alignment film 24 (the columns 24a) is also covered with a hydrophobic film 25. The vapor deposition in which an evaporated inorganic material deposits obliquely with respect to the normal to a base substrate surface is hereinafter referred to as "oblique vapor deposition".

The film thickness of the alignment films 18, 24 that are formed by using oblique vapor deposition is approximately 30 nm to 100 nm.

In the liquid crystal panel 110 in which the liquid crystal layer 50 is interposed between the element substrate 10 and the counter substrate 20, liquid crystal molecules LC are oriented generally vertically on the surfaces of the hydrophobic films 19, 25 while the liquid crystal molecules LC incline in a direction that forms a predetermined angle $\theta p$ with respect to the normal to the base substrates 10s, 20s. The predetermined angle $\theta p$ is also called "pretilt angle". The pretilt angle $\theta p$ according to the embodiment is approximately 3 to 5 degrees.

When an alternating potential, which alternates relative to a reference potential (LCCOM) applied to the counter electrode 23 of the counter substrate 20, is applied to the pixel electrode 15 of the element substrate 10 and generates an electric field, liquid crystal molecules LC having negative dielectric anisotropy incline in a direction orthogonal to the direction of the electric field. Thus, polarized light being incident on the liquid crystal layer 50 is modulated by the alternating potential generated in accordance with image data.

The hydrophobic films 19, 25 are formed by surface treatment that imparts hydrophobicity to the alignment films 18, 24, which are inorganic alignment films. Regarding the surface treatment, the hydrophobic films 19, 25 according to the embodiment are formed by performing coupling treatment in which a silane compound (silane coupling agent) is brought into contact with the surface of each inorganic alignment film so that the silane compound (silane coupling agent) undergoes a dehydration reaction with silanol groups on the surface of the inorganic alignment film. Formation of the hydrophobic films 19, 25 on the alignment films 18, 24 suppresses photochemical reactions between the liquid crystal molecules LC and silanol groups, which leads to stable alignment of the liquid crystal molecules LC when light is incident on the liquid crystal layer 50.

However, an excessive thickness of the hydrophobic films 19, 25 has a negative impact on the alignment performance of the alignment films 18, 24 that have been formed by using oblique vapor deposition. The alignment films 18, 24 formed by using oblique vapor deposition have minute irregularities on the surfaces thereof. Thus, it is preferable to form the hydrophobic films 19, 25 that cover the minute irregularities as thin as possible. A method of forming the hydrophobic films 19, 25 will be described later.

As illustrated in FIG. 5, the direction of the oblique vapor deposition of the alignment film 18 on the element substrate 10 is, for example, the direction indicated by the dotted arrow that extends in a direction from the top right to the bottom left in the pixel region E1. On the other hand, the direction of the oblique vapor deposition of the alignment film 24 on the counter substrate 20 is, for example, the direction indicated by the solid arrow that extends in a direction from the bottom left to the top right in the pixel region E1. Each of the dotted arrow and the solid arrow intersects the Y direction at an angle of θa. In other words, each liquid crystal molecule LC inclines at a pretilt angle of θp, and the uniaxial direction of the liquid crystal molecule LC forms an angle of θa with respect to the Y direction (azimuth). Such a state of alignment of the liquid crystal molecules LC is called "uniaxial and substantially vertical alignment (VA)".

In the uniaxial and substantially vertical alignment, each direction of the oblique vapor deposition is appropriately determined on the basis of the optical design conditions of the liquid crystal device 100. In the embodiment, a pair of polarizing elements are disposed, for example, such that the respective transmission axes, or the respective absorbing axes, of the polarizing elements are oriented in the X direction and in the Y direction with the liquid crystal panel 110 interposed between the pair of the polarizing elements. Each direction (azimuth) of the oblique vapor deposition intersects, at an angle θa of 45 degrees, the respective transmission axes, or the respective absorbing axes, of the polarizing elements that are disposed on the light incident side and the light emitting side. Such uniaxial and substantially vertical alignment provides the liquid crystal panel 110 with a maximum contrast in the normally black mode. Note that each direction (azimuth) of the oblique vapor deposition is not limited to the foregoing uniaxial direction (azimuth) but may be, for example, a direction that intersects the Y direction at an angle of θa and that extends from the top left to the bottom right or from the bottom right to the top left in the pixel region E1.

Figure 6:
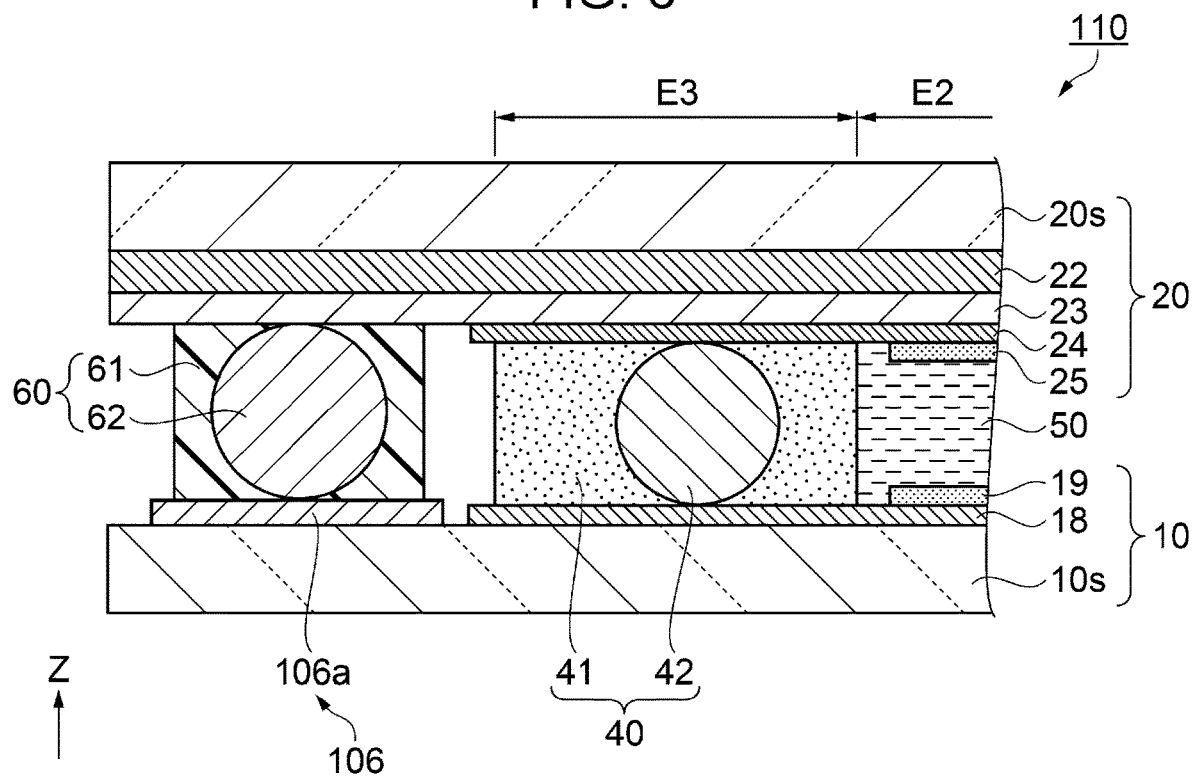
FIG. 6 is a partial cross-sectional view schematically illustrating a structure related to a sealant and a vertical conduction section in the liquid crystal panel.

Next, a structure related to the sealant 40 and the vertical conduction sections 106 will be described with reference to FIG. 6. FIG. 6 is a partial cross-sectional view schematically illustrating a structure related to a sealant and a vertical conduction section in the liquid crystal panel.

As illustrated in FIG. 6, the element substrate 10 and the counter substrate 20 that opposes the element substrate 10 are adhered to each other via the sealant 40. The sealant 40 according to the embodiment includes a photo-curable adhesive 41 and a gapping material 42. The gapping material 42 defines the thickness of the liquid crystal layer 50 that is interposed between the element substrate 10 and the counter substrate 20. Glass fibers or beads (spherical bodies) having, for example, an average diameter of 1 to 3 μm are used as the gapping material 42. It is preferable that the gapping material 42 not easily deform when pressed. The sealant 40 including the gapping material 42 is disposed so as to be in contact with the alignment film 18 on the element substrate 10 and also in contact with the alignment film 24 on the counter substrate 20.

The vertical conduction sections 106 are disposed at the four corners of the counter substrate 20 as described above (see FIG. 1). A connection portion 106a is disposed on the element substrate 10 at a position corresponding to each of the vertical conduction sections 106. The connection portion 106a is formed, for example, by using the same material as the pixel electrodes 15 and is patterned on the layer in the element substrate 10 in which the pixel electrodes 15 are formed. Note that the pixel electrodes 15 are covered with the alignment film 18 but the connection portion 106a is not.

The counter electrode 23 is formed over the entire surface of the counter substrate 20. A portion of the counter electrode 23 that corresponds to the sealant-surrounded region E2 and the sealing region E3 is covered with the alignment film 24, while a region between the periphery of the sealing region E3 and the periphery of the base substrate 20s is not covered with the alignment film 24. When the element substrate 10 and the counter substrate 20 are adhered to each other by using the sealant 40, a conductive member 60 is disposed between the connection portion 106a and the counter electrode 23. The conductive member 60 includes a resin 61 having an adhesive function and conductive particles 62. In the embodiment, silver (Ag) particles having a high electric conductivity are used as the conductive particles 62. The average diameter of the conductive particles 62 is larger, for example, by about 0.5 μm, than the average diameter of the gapping material 42 of the sealant 40. In addition, the amount of the conductive particles 62 in the conductive member 60 is set in order to provide a sufficient weight percent such that when the conductive member 60 is laid on the connection portion 106a, at least one or more of the conductive particles 62 are included therein. The connection portion 106a and the counter electrode 23 are adhered with pressure with the conductive member 60 interposed therebetween. The conductive particles 62 are thereby brought into contact with the connection portion 106a and with the counter electrode 23, which establishes an electrical connection between the connection portion 106a and the counter electrode 23. Note that although the conductive particle 62 is illustrated as a spherical body in FIG. 6, the shape of the conductive particle 62 is not limited to a spherical body.

According to the embodiment, the hydrophobic film 19 that covers the alignment film 18 of the element substrate 10 is removed from a region that is located outside the sealant-surrounded region E2 in which the liquid crystal layer 50 is interposed, and that includes the sealing region E3 in which the sealant 40 is disposed. The hydrophobic film 25 that covers the alignment film 24 of the counter substrate 20 is removed in the same manner. In other words, without interposing the hydrophobic films 19, 25, the element substrate 10 and the counter substrate 20 are adhered to each other by the sealant 40, and the connection portion 106a and the counter electrode 23 are electrically connected to each other via the conductive member 60.

Figure 7:
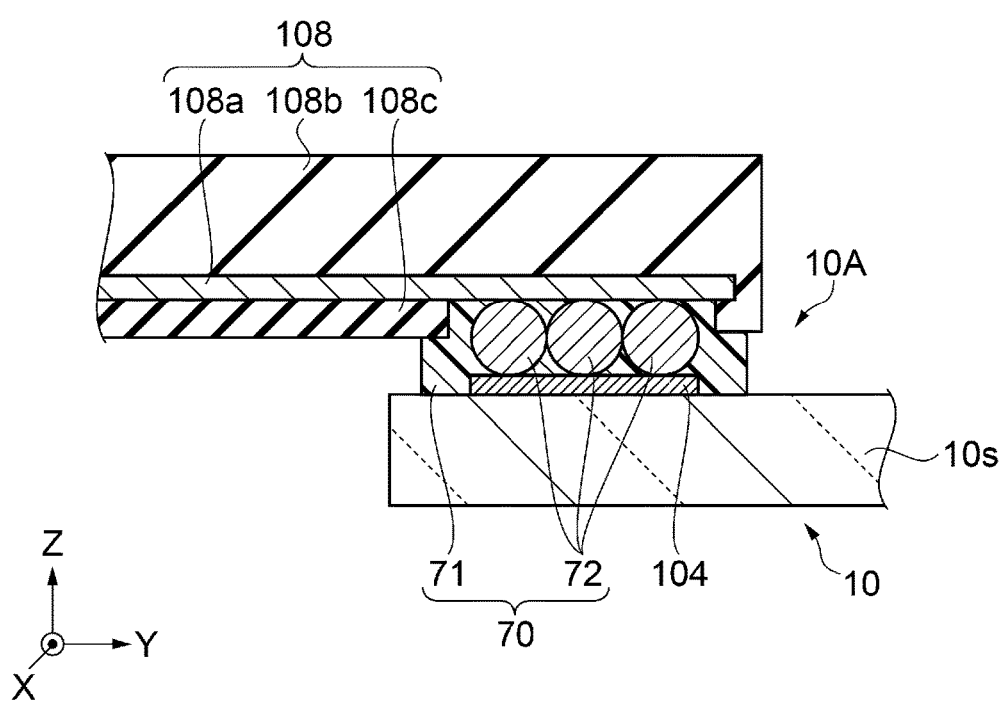
FIG. 7 is a partial cross-sectional view schematically illustrating an installation state of an FPC at a terminal section of an element substrate.

Next, connection (i.e., installation) of an FPC 108 at a terminal section of the element substrate 10 will be described with reference to FIG. 7. FIG. 7 is a partial cross-sectional view schematically illustrating an installation state of the FPC 108 at a terminal section of the element substrate 10.

As illustrated in FIG. 7, the FPC 108 is mounted on a terminal section 10a of the element substrate 10 at which the external connection terminals 104 are disposed. The FPC 108 establishes connection with external circuits for driving the liquid crystal device 100. For example, the FPC 108 has a three-layer structure including a base substrate 108b that is insulative, a wiring pattern 108a, and a coverlay 108c that covers the wiring pattern 108a. The wiring pattern 108a is formed by patterning a conductive film, such as a copper foil, affixed to the base substrate 108b. The end of the FPC 108 that is not covered with the coverlay 108c is a connection portion of the FPC 108. The FPC 108 is electrically connected to the external connection terminals 104 via an anisotropic conductive film 70 (ACF 70), which serves as a conductive member.

The ACF 70 is a resin film having a predetermined width and thickness, which is formed by applying a mixture of anisotropic conductive particles 72 and a heat-curable resin 71 onto a base substrate. The anisotropic conductive particles 72 are spherical bodies each made of a metal particle or an insulative core that has a metal-plated surface layer of, for example, nickel (Ni) or gold (Au). The metal-plated surface is coated with an insulation film that can be destroyed by heat or by pressure. The anisotropic conductive particles 72 have a diameter of approximately 3 to 5 μm.

After the ACF 70 is affixed to the terminal section 10a of the element substrate 10, the FPC 108 is aligned with, and placed on, the external connection terminals 104. Subsequently, the FPC 108 and the external connection terminals 104 are subjected to thermocompression for a predetermined amount of time, which causes the anisotropic conductive particles 72 to electrically connect the wiring pattern 108a to the external connection terminals 104. The anisotropic conductive particles 72 only become conductive in the thermocompression direction (Z direction). Accordingly, adjacent ones of the external connection terminals 104 arranged at the terminal section 10a are not short-circuited by the anisotropic conductive particles 72.

In the element substrate 10, the alignment film 18 and the hydrophobic film 19 are not provided in a region that overlaps the external connection terminals 104 when viewed in plan view. In the terminal section 10a on which the FPC 108 is mounted, the FPC 108 and the external connection terminals 104 are electrically connected to each other via the ACF 70 without interposing the hydrophobic film 19, as are the vertical conduction sections 106. Method of Manufacturing Liquid Crystal Device.

Figure 8:
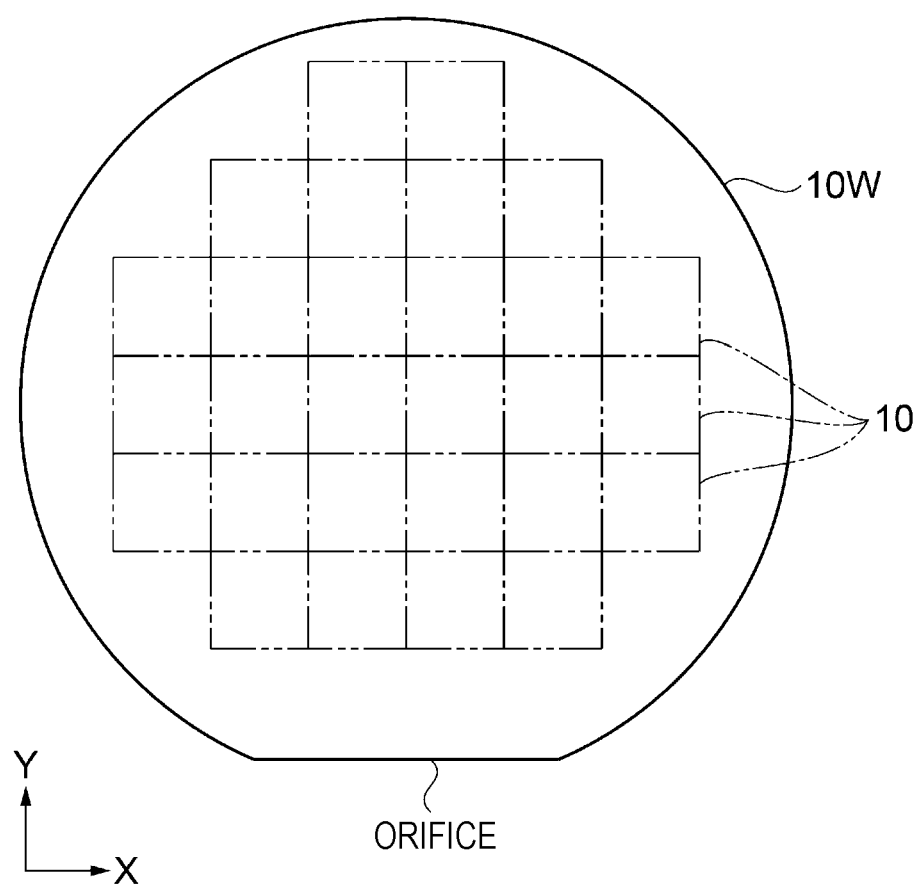
FIG. 8 is a plan view schematically illustrating a mother substrate on which element substrates are allocated.
Figure 9:
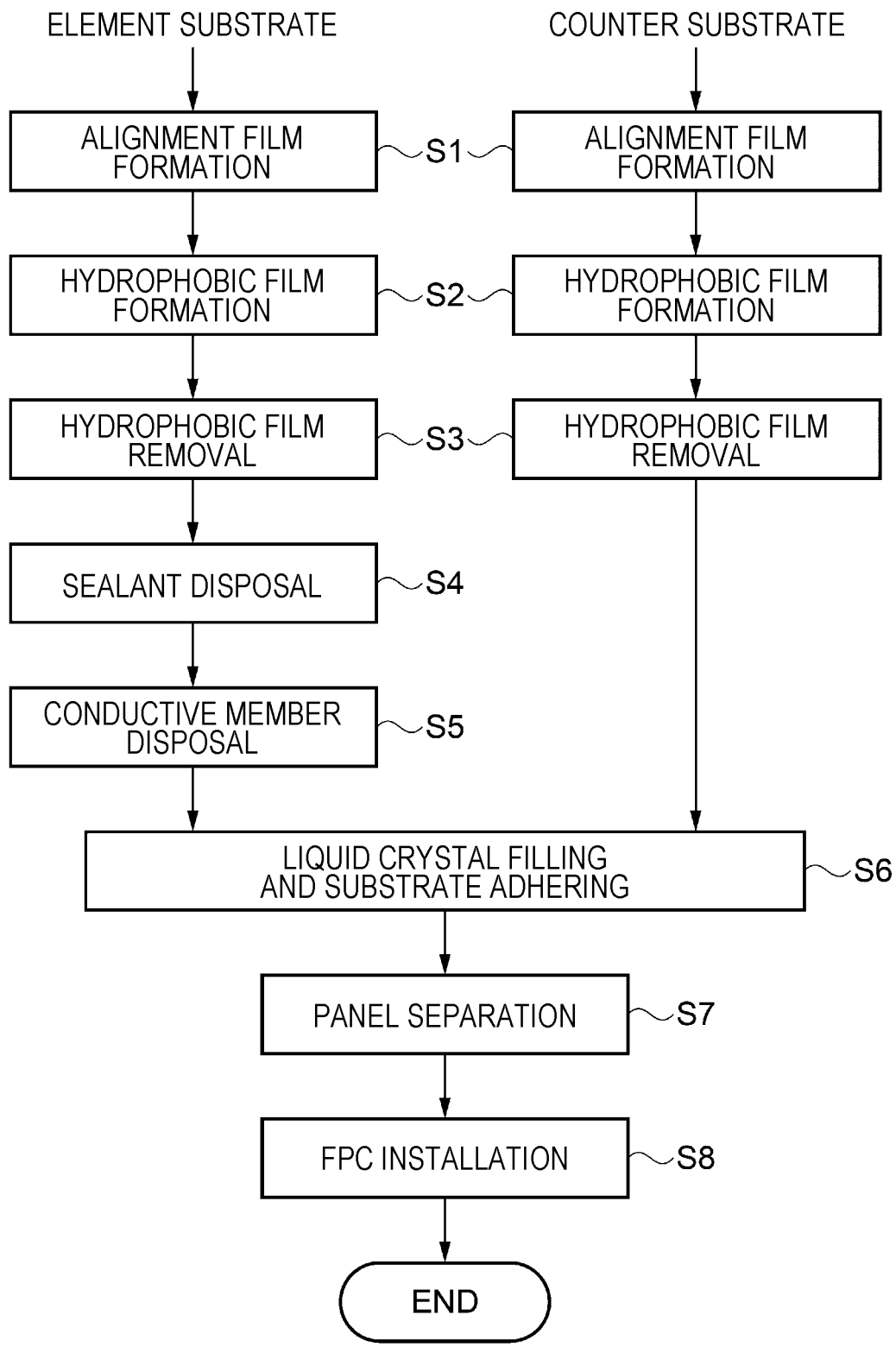
FIG. 9 is a flowchart illustrating a method of manufacturing a liquid crystal device.

Next, a method of manufacturing the liquid crystal device 100 according to the embodiment will be outlined with reference to FIG. 8 and FIG. 9. FIG. 8 is a plan view schematically illustrating a mother substrate on which element substrates are arranged. FIG. 9 is a flowchart illustrating a method of manufacturing the liquid crystal device.

The liquid crystal device 100 according to the embodiment is a microdisplay that can be used as a light modulator of a projection-type display apparatus, which will be described later. The element substrate 10 and the counter substrate 20 that constitute the microdisplay are manufactured by using mother substrates because of high productivity.

As illustrated in FIG. 8, for example, the element substrates 10 are manufactured in a state in which a plurality of the element substrates 10 are arranged on a mother substrate 10W that is wafer-shaped. In the mother substrate 10W, an orifice is formed by cutting off a portion of the substrate, and the element substrates 10 are arranged in a matrix in the X, Y directions with respect to the orifice. Alignment marks, which are used for registration purposes during manufacturing of the element substrates 10, are also provided on the mother substrate 10W with respect to the orifice. The counter substrates 20 are also manufactured in the state in which a plurality of the counter substrates 20 are arranged on the mother substrate. Note that reference sign 20W denotes a mother substrate for the counter substrates 20. Also note that the mother substrates 10W, 20W are not limited to having the wafer shape, but may be shaped, for example, like a rectangle.

The method of manufacturing the liquid crystal device 100 according to the embodiment includes a step of manufacturing the element substrates 10 by using a mother substrate 10W and a step of manufacturing the counter substrates 20 by using a mother substrate 20W. Note that known methods can be used in a step of forming a pixel circuit and peripheral circuits for each element substrate 10 on the mother substrate 10W. Known methods can also be used in a step of forming the edge section 21, the planarizing layer 22, and the counter electrode 23 for each counter substrate 20 on the mother substrate 20W. Accordingly, steps related to the method of manufacturing the liquid crystal device according to the invention will be described below. More specifically, as illustrated in FIG. 9, the method of manufacturing the liquid crystal device 100 includes an alignment film formation step (step S1), a hydrophobic film formation step (step S2), and a hydrophobic film removal step (step S3). In the alignment film formation step (step S1), the alignment films 18, 24, which are both inorganic alignment films, are formed on respective mother substrates 10W and 20W. In the hydrophobic film formation step (step S2), the hydrophobic films 19, 25 are formed so as to cover respective ones of the alignment films 18, 24. In the hydrophobic film removal step (step S3), at least portions of the hydrophobic films 19, 25 that have been formed are removed from respective regions outside the pixel region E1. The method of manufacturing the liquid crystal device 100 further includes a sealant disposal step (step S4), a conductive member disposal step (step S5), and a liquid crystal filling and substrate adhering step (step S6). In the sealant disposal step (step S4), the sealant 40 is disposed for each of the element substrates 10 on the mother substrate 10W. In the conductive member disposal step (step S5), the conductive member 60 is disposed for each of the element substrates 10 on the mother substrate 10W. In the liquid crystal filling and substrate adhering step (step S6), liquid crystal is filled between the mother substrate 10W and the mother substrate 20W, and the mother substrate 10W and the mother substrate 20W are adhered to each other. In addition, the method of manufacturing the liquid crystal device 100 further includes a panel separation step (step S7), in which individual ones of the liquid crystal panels 110 are taken out from the adhered mother substrates 10W and 20W, and a FPC installation step (step S8), in which the FPC 108 is mounted on each liquid crystal panel 110.

In the alignment film formation step in step S1, for example, a mother substrate 10W is placed in a chamber having an evaporation source of silicon oxide obliquely at a predetermined inclination angle with respect to the normal to the evaporation source. The alignment film 18 of silicon oxide is formed on the surface of the mother substrate 10W by evaporating silicon oxide from the evaporation source. The alignment film 24 is also formed on the surface of the mother substrate 20W in the same manner by depositing silicon oxide obliquely. Note that the directions of the oblique vapor deposition for the mother substrate 10W and the mother substrate 20W are set to coincide with the directions of the oblique vapor deposition illustrated in FIG. 5. During the oblique vapor deposition, a metal mask having openings at positions corresponding to the sealant-surrounded region E2 and the sealing region E3 is used for each of the mother substrates 10W, 20W so as not to form the alignment film in the region outside the sealing region E3. The operation proceeds to step S2.

Figure 10:
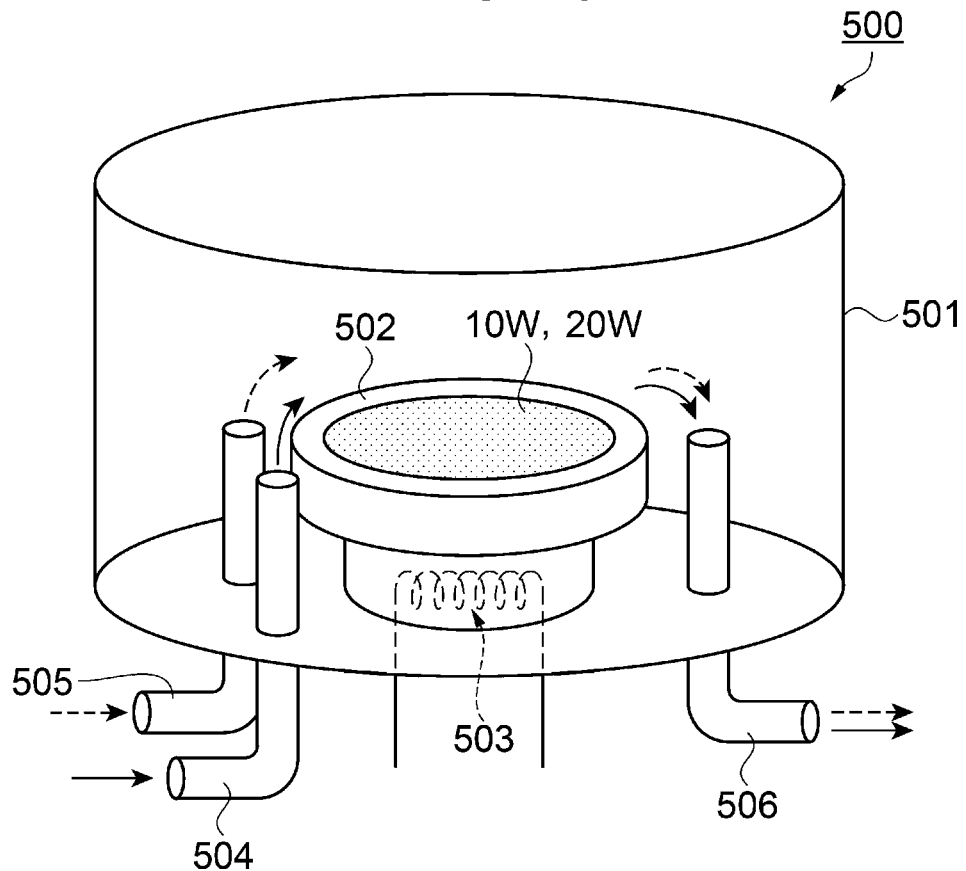
FIG. 10 is a view schematically illustrating an example of a film-forming apparatus for forming a hydrophobic film.
Figure 11:
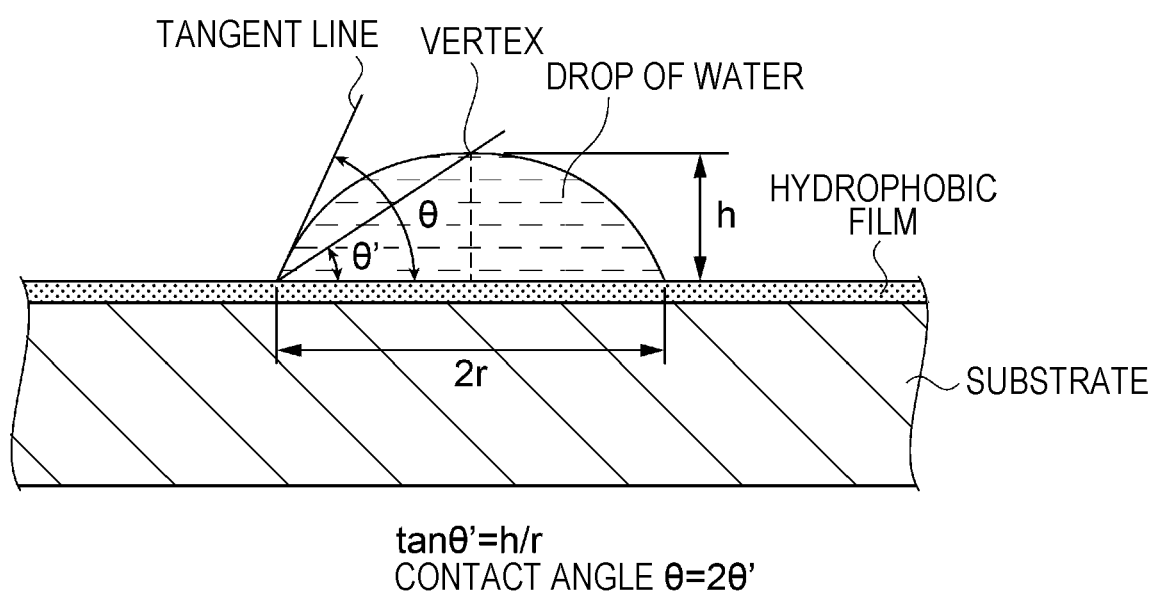
FIG. 11 is a view illustrating a method of measuring a contact angle for a hydrophobic film.
Figure 12:
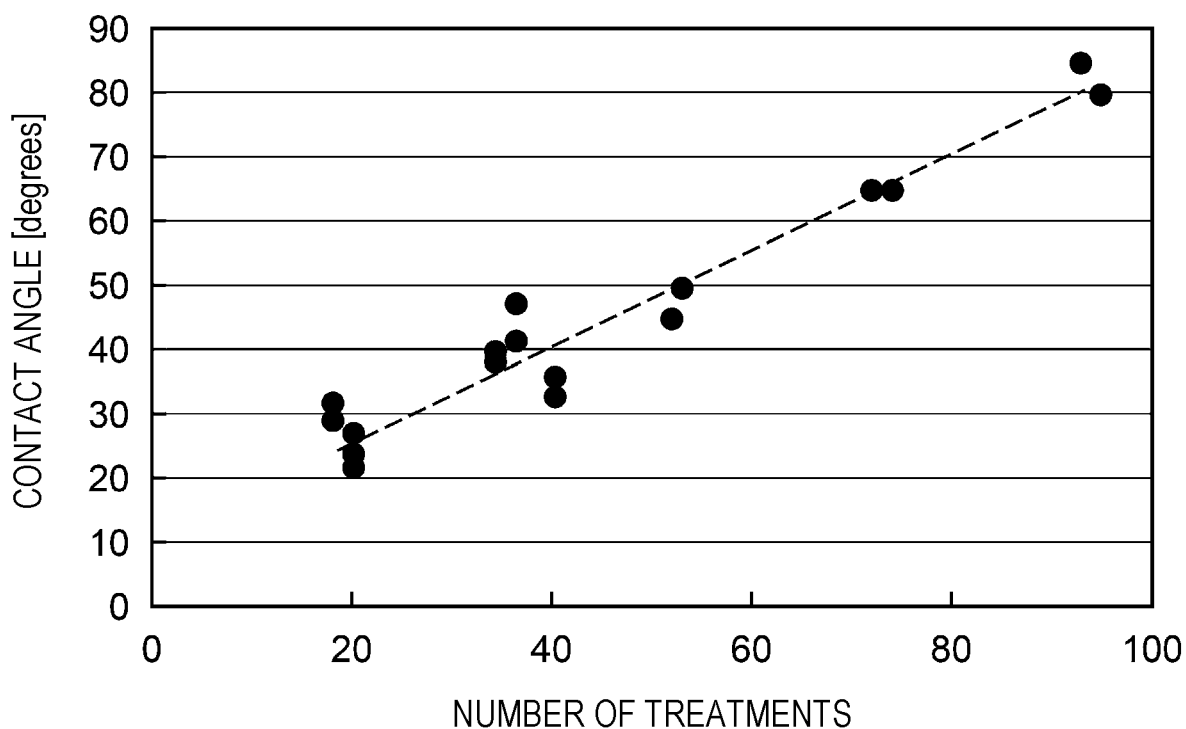
FIG. 12 is a graph illustrating a relationship between the number of hydrophobic film formation treatments and contact angles.

The hydrophobic film formation step in step S2 will be described with reference to FIGS. 10 to 12. FIG. 10 is a view schematically illustrating an example of a film-forming apparatus that forms a hydrophobic film. FIG. 11 is a view illustrating a method of measuring a contact angle for a hydrophobic film. FIG. 12 is a graph illustrating a relationship between the number of hydrophobic film formation treatments and contact angles.

In the hydrophobic film formation step in step S2, for example, a film-forming apparatus 500 as illustrated in FIG. 10 is used. The film-forming apparatus 500 includes a chamber 501 that is cylindrically shaped, a support platform 502 provided in the chamber 501 for a workpiece to be placed thereon, a first gas inlet pipe 504, a second gas inlet pipe 505, and a gas discharge pipe 506. In addition, a heater 503 is provided at the support platform 502 so as to be able to heat a workpiece placed on the support platform 502. Although not illustrated in FIG. 10, the first gas inlet pipe 504 is connected to a reactant gas generation source so as to be able to introduce the reactant gas into the chamber 501. The second gas inlet pipe 505 is able to introduce air or a carrier gas such as nitrogen gas into the chamber 501. The gas discharge pipe 506 is connected to a gas discharge apparatus, such as a vacuum pump, and is able to depressurize the chamber 501 or discharge various types of gases that have been introduced into the chamber 501.

In the embodiment, after a mother substrate 10W has been placed as a workpiece on the support platform 502, the chamber 501 is depressurized to a predetermined degree of vacuum (for example, 1 to 2 Pa) by discharging the air within the chamber 501 via the gas discharge pipe 506. Next, the mother substrate 10W is heated by the heater 503 to, for example, 150° C. Subsequently, an evaporated silane coupling agent is generated as a reactant gas from the reactant gas generation source, and the reactant gas is mixed with the carrier gas and introduced into the chamber 501 via the first gas inlet pipe 504. The mother substrate 10W is exposed to the atmosphere containing the reactant gas within the chamber 501 and is left in this state for a predetermined amount of time (for example, 5 minutes). Thus, the silane coupling agent reacts with the alignment film 18 that has been formed on the mother substrate 10W. Silanol groups (Si—OH) are present on the surface of the alignment film 18, which is an inorganic alignment film. The silanol groups undergo dehydration reaction with the silane coupling agent so that hydroxyl groups (—OH) are substituted by silane coupling agent molecules. Next, a predetermined amount of the carrier gas alone is introduced from the second gas inlet pipe 505. Meanwhile, the reactant gas and carrier gas, which have been introduced in the chamber 501, are discharged via the gas discharge pipe 506. A predetermined degree of vacuum is thereby achieved again in the chamber 501. A series of the operations such as the decompression, the introduction of the reactant gas (reaction), and the gas discharge takes approximately 10 minutes. By repeating the series of operations several times, the hydrophobic film 19 is formed on the surface of the mother substrate 10W. The hydrophobic film 25 is also formed on the mother substrate 20W in the same manner. As described above, from a viewpoint of controlling the alignment of the liquid crystal molecules LC, it is preferable that the hydrophobic films 19, 25 cover the surfaces of the alignment films 18, 24 uniformly and be as thin as possible at the same time. Accordingly, the reaction is carried out multiple times while reducing the amount of the silane coupling agent in the reactant gas contributing to the reaction each time as much as possible. The hydrophobic films 19, 25 on the order of nanometers are thereby formed. The formation of the hydrophobic films 19, 25 is controlled by measuring water contact angles. The silane coupling agent contained in the reactant gas is preferably a low molecular weight compound having a carbon number of C6 to C18. In the embodiment, decyltrimethoxysilane having a carbon number of C10 is used as the silane coupling agent. Decyltrimethoxysilane has an alkyl group that functions as a hydrophobic group. A hydrophobic film is likely to be formed on regions on the mother substrates 10W, 20W where the alignment film is not formed.

As illustrated in FIG. 11, when a drop of water is placed on a hydrophobic film, the drop of water becomes hemispherical due to interfacial tension between the water and the hydrophobic film. Here, the angle between the hydrophobic film and a tangent line of the drop of water is denoted by the water contact angle $\theta$. Let $\theta'$ be the angle between the hydrophobic film and a line passing through the edge and the vertex of the drop of water, h be the height of the drop of water, and 2r be the diameter of the drop of water. The water contact angle $\theta$ is given by $\theta=2\theta'$. Because of $\tan \theta'=h/r$, the water contact angle $\theta$ can be obtained by calculating $h/r$. Such a method of measuring the water contact angle $\theta$ (static method) is, for example, stipulated in JIS R 3257; 1999. In accordance with the measurement conditions stipulated by JIS, a drop of distilled water in an amount of 1 to 4 microliters is placed on a target surface in an environment of a room temperature of 25° C.±5° C. and a humidity of 50%±10%. Measurement is to be carried out within one minute after the drop of water has been placed. The water contact angle $\theta$ measured in accordance with the static method is hereinafter referred to simply as "contact angle $\theta$".

The relationship between the number of treatments using a silane coupling agent and the contact angle of the hydrophobic film was examined while the number of treatments was set to 20 to 90. Obtained results are illustrated in FIG. 12. As illustrated in FIG. 12, the contact angle increases as the number of treatments increases. When the number of treatments is less than 40, contact angles are somewhat dispersed. Accordingly, when the number of treatments is less than 40, it is not likely that the hydrophobic film is formed uniformly. Thus, the number of treatments was set from 40 to 50 or more in order to obtain uniform film formation without a large dispersion of contact angles. In other words, the number of treatments is regulated so as to obtain a contact angle of 40 degree or more. The operation proceeds to step S3.

Figure 13:
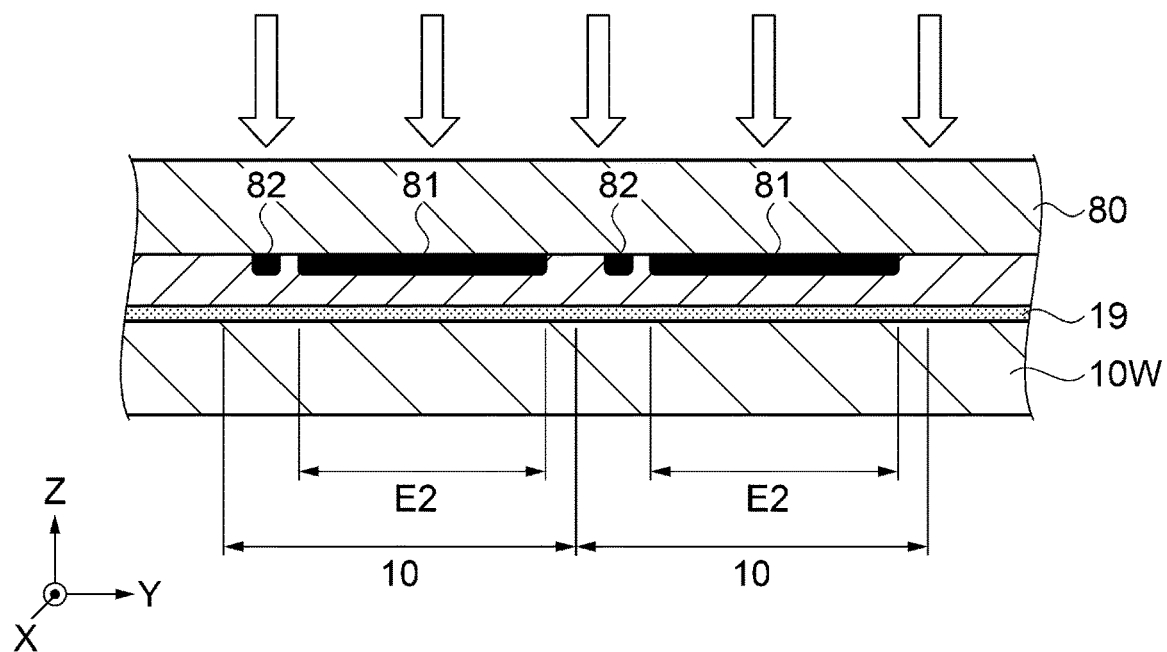
FIG. 13 is a cross-sectional view schematically illustrating a hydrophobic film removal step.
Figure 14:
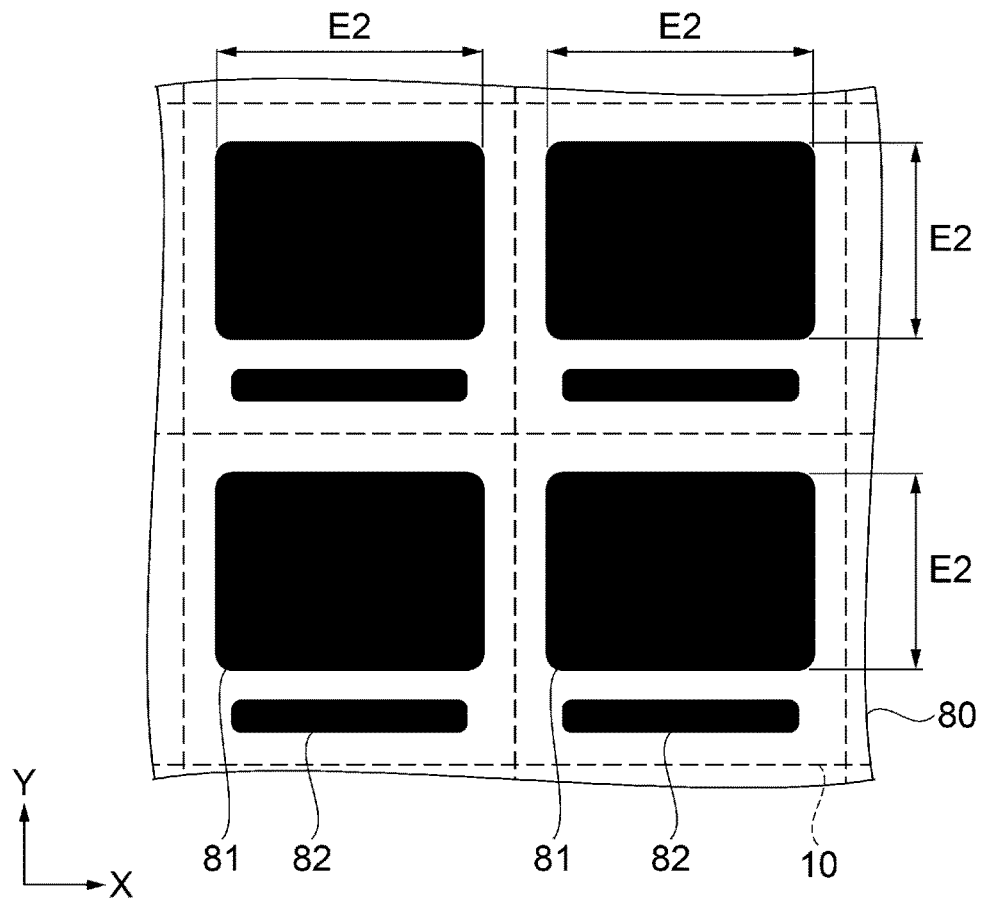
FIG. 14 is a plan view schematically illustrating light-blocking patterns of a mask for exposure.
Figure 15:
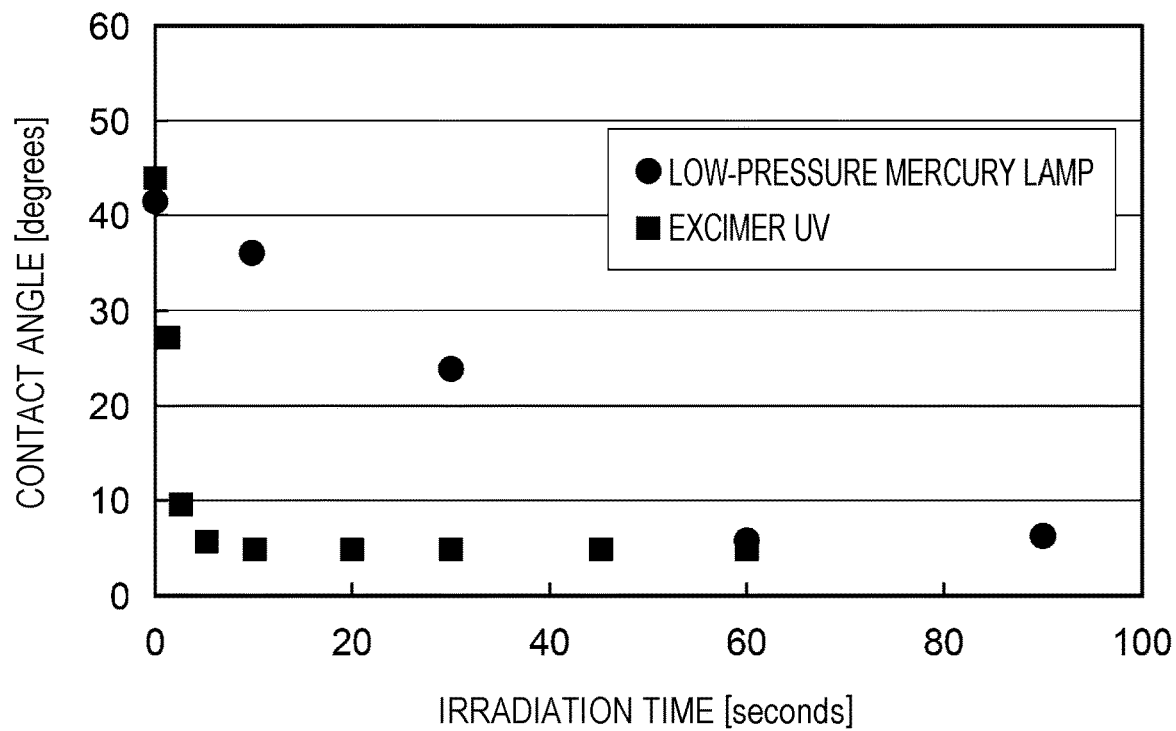
FIG. 15 is a graph illustrating a relationship between ultraviolet (UV) ray irradiation time and contact angles.

The hydrophobic film removal step in step S3 will be described with reference to FIGS. 13 to 15. FIG. 13 is a cross-sectional view schematically illustrating a hydrophobic film removal step. FIG. 14 is a plan view schematically illustrating light-blocking patterns of a mask for exposure. FIG. 15 is a graph illustrating a relationship between ultraviolet (UV) ray irradiation time and contact angles.

As illustrated in FIG. 13, in the hydrophobic film removal step in step S3, the mother substrate 10W with the hydrophobic film 19 formed thereon and a mask 80 for exposure are disposed at a predetermined position so as to face each other. In other words, the element substrate 10 is masked. Subsequently, the masked substrate is irradiated with ultraviolet (UV) rays in ambient air (in an atmosphere containing oxygen). The mask 80 has first light-blocking patterns 81 and second light-blocking patterns 82 provided therein. As illustrated in FIG. 13 and FIG. 14, the first light-blocking patterns 81 are shaped so as to correspond to respective sealant-surrounded regions E2 on the mother substrate 10W. The second light-blocking patterns 82 are shaped like islands extending in the X direction along the first light-blocking patterns 81, respectively. The second light-blocking patterns 82 are disposed so as to overlap respective ones of the data line driving circuits 101 of the element substrates 10. In other words, when the mother substrate 10W is disposed at a predetermined position so as to face the mask 80 for exposure and is irradiated with ultraviolet (UV) rays with the mask 80 being interposed, the ultraviolet (UV) rays do not impinge on the sealant-surrounded regions E2 and the data line driving circuits 101 of the element substrates 10. In each of the element substrates 10 of the mother substrate 10W, the ultraviolet (UV) rays impinge on the regions excluding the sealant-surrounded region E2 and also excluding the region in which the data line driving circuit 101 is formed. Irradiation with ultraviolet (UV) rays activates oxygen in air and generates ozone. Ozone, which is highly active, oxidizes and decomposes the hydrophobic film 19. In other words, regions of the hydrophobic film 19 excluding the regions masked by the first light-blocking patterns 81 and the second light-blocking patterns 82 are decomposed by irradiation with ultraviolet (UV) rays and thereby removed. The same method is applied for removing portions of the hydrophobic film 25 formed on the mother substrate 20W for the counter substrates 20. In other words, the mother substrate 20W is disposed so as to face the mask 80 and irradiated with ultraviolet (UV) rays in ambient air. In the embodiment, removal of the hydrophobic films 19, 25 is also controlled by measuring the contact angle.

As illustrated in FIG. 15, when the contact angle for the hydrophobic film is 40 degrees or more initially, the hydrophobic film is irradiated with ultraviolet (UV) rays for 30 seconds by using a low-pressure mercury lamp as the light source, which results in a contact angle of less than 30 degrees, while irradiation for 60 seconds results in a contact angle of less than 10 degrees. In contrast, by using a xenon lamp as the light source and irradiating the hydrophobic film with excimer UV having a wavelength of 200 nm or less for at least 5 seconds, the contact angle of the irradiated region becomes less than 10 degrees. It is likely that compared with the low-pressure mercury lamp, the excimer UV contains a larger amount of ultraviolet rays having a wavelength of 200 nm or less and generates a larger amount of ozone by activating oxygen in air. From a viewpoint of productivity in removing the hydrophobic films 19, 25, it is desirable that the hydrophobic films 19, 25 be irradiated with ultraviolet (UV) rays such that the contact angles become 30 degrees or less, preferably, 10 degrees or less.

In the hydrophobic film removal step according to the embodiment, the mask 80 and the mother substrate to be treated were arranged at predetermined positions so as to face each other with a 30 to 50 μm gap therebetween. Subsequently, the mask 80 and the mother substrate were irradiated with excimer UV for 5 seconds by using a xenon lamp that was adjusted so as to emit ultraviolet with a peak wavelength of 172 nm and an irradiation intensity of 20 mW/cm². In the mother substrate 10W for the element substrates 10, the hydrophobic film 19 that was formed was removed from regions excluding the sealant-surrounded regions E2 and also excluding the regions in which the data line driving circuits 101 had been formed. In the mother substrate 20W for the counter substrates 20, the hydrophobic film 25 that was formed was removed from regions excluding the sealant-surrounded regions E2. The regions from which the hydrophobic films 19, 25 are removed exhibit a contact angle of less than 10 degrees. The operation proceeds to step S4.

In the sealant disposal step in step S4, the sealant 40 that is photo-curable and that contains the gapping material 42 was applied to the sealing region E3 that surrounded the sealant-surrounded region E2 of each element substrate 10 on the mother substrate 10W. A constant dispensing method was adopted in applying the sealant 40. Since the hydrophobic film 19 is removed from the surface of the mother substrate 10W that overlaps the sealant 40, the adhesive 41 is reliably applied with a stable shape by using the constant dispensing method without being repelled by the hydrophobic film 19. The operation proceeds to step S5.

In the conductive member disposal step in step S5, the conductive member 60 was applied to the connection portions 106a that were disposed outside the sealant-surrounded region E2 of each element substrate 10 on the mother substrate 10W. The conductive member 60 was applied by also using the constant dispensing method. Since the hydrophobic film 19 is removed from each connection portion 106a on the mother substrate 10W, which overlaps the conductive member 60, the conductive member 60 is applied in a stable shape by using the constant dispensing method. The operation proceeds to step S6.

In the liquid crystal filling and substrate adhering step in step S6, the mother substrate 10W, to which the sealant 40 and the conductive member 60 have been applied for each element substrate 10, is placed in a depressurized environment, and a predetermined amount of liquid crystal is dropped into each region surrounded by the sealant 40. Subsequently, the mother substrate 20W on which a plurality of the counter substrates 20 have been disposed is placed over the mother substrate 10W into which liquid crystal has been dropped, and the mother substrates 10W, 20W are adhered to each other under pressure (ODF method). The sealant 40 that has been applied is thereby squashed to cause the gapping material 42 included in the sealant 40 to maintain a predetermined gap between the element substrates 10 and the corresponding counter substrates 20, which are disposed so as to face each other. The adhered mother substrates 10W, 20W are released from the depressurized condition to the atmosphere. The sealant 40 is hardened by irradiation with ultraviolet rays and by heating, and thus, the mother substrate 10W (the element substrates 10) and the mother substrate 20W (the counter substrates 20) are bonded together. At the same time, the counter electrode 23 of each of the counter substrate 20 is electrically connected to the connection portions 106a of corresponding one of the element substrates 10 via the conductive member 60. The operation proceeds to step S7.

In the panel separation step in step S7, individual ones of the liquid crystal panels 110 are taken out by dividing, at predetermined positions, the mother substrates 10W, 20W that have been bonded together with the liquid crystal filled therein. Dicing, laser cutting, or scribing may be used as the dividing method. The operation proceeds to step S8.

Figure 16:
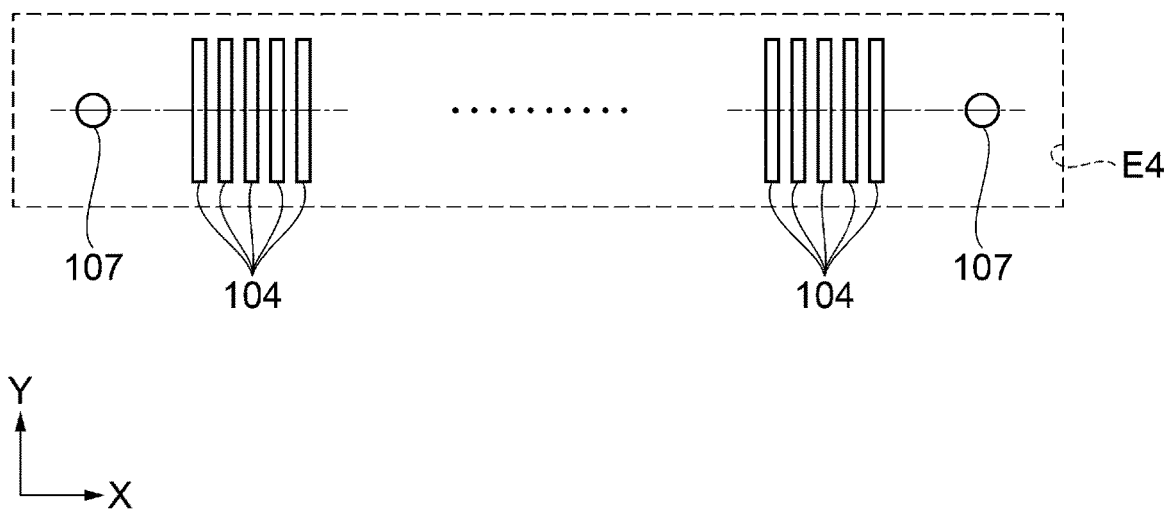
FIG. 16 is a plan view schematically illustrating an arrangement of external connection terminals at a terminal section of the liquid crystal panel.

In the FPC installation step in step S8, the ACF 70 is transferred and stuck to the terminal section 10a of each of the liquid crystal panels 110, and the FPC 108 is mounted, by using thermocompression, onto the terminal section 10a with the ACF 70 therebetween (see FIG. 7). FIG. 16 is a plan view schematically illustrating an arrangement of the external connection terminals at the terminal section of a liquid crystal panel. As illustrated in FIG. 16, a plurality of the external connection terminals 104 are arrayed at a predetermined spacing in the X direction on the terminal section 10a of the liquid crystal panel 110. Alignment marks 107 are provided at positions away from each other with a plurality of the external connection terminals 104 therebetween in the X direction. In performing the thermocompression, registration of the FPC 108 is carried out by using the alignment marks 107. In the case where an installation region E4 is a region indicated by a dotted line and including a plurality of the external connection terminals 104 and a pair of the alignment marks 107, the ACF 70 needs to be transferred within the installation region E4. In the embodiment, since the hydrophobic film 19 is removed from the installation region E4, which the ACF 70 overlaps, positional deviation of the ACF 70 due to the hydrophobic film 19 does not occur, and thus, the connection between the FPC 108 and the external connection terminals 104 is not hampered.

The liquid crystal device 100, in which the FPC 108 is mounted on the liquid crystal panel 110, is completed through the steps described above. Note that in the case where the liquid crystal device 100 is adopted as a light valve for a projection-type display apparatus, which will be described later, the liquid crystal device 100 is used in combination with transparent dustproof substrates, which prevents foreign matter stuck to the apparatus from adversely affecting screen display during projection, or in combination with optical elements, such as polarizing plates and phase plates. The respective transparent dustproof substrates and the respective optical elements are disposed on the light incident side and light emitting side of the liquid crystal device 100.

With the method of manufacturing the liquid crystal device 100 according to the present embodiment, the following advantageous effects are obtained. The hydrophobic films 19, 25, which cover respective ones of the alignment films 18, 24, as inorganic alignment films, on the element substrate 10 and the counter substrate 20, are formed such that silanol groups (Si—OH) on the surfaces of the inorganic alignment films react with a silane compound (silane coupling agent) and hydroxyl groups are replaced by silane compound molecules. The reaction between the silanol groups and liquid crystal molecules LC is thereby suppressed so that the liquid crystal molecules LC do not deteriorate easily. Thus, the liquid crystal devices 100 that are capable of a stable display for a long period of time can be manufactured or provided.

In the hydrophobic film formation step, the hydrophobic films 19, 25 are formed by exposing the element substrates 10 and the counter substrates 20 having inorganic alignment films to the reactant gas containing the evaporated silane compound (silane coupling agent). In addition, the formation state of each of the hydrophobic films 19, 25 is controlled by measuring the contact angle (water contact angle), and the number of treatments is regulated such that the contact angle becomes 40 degrees or more. Compared with such methods as vacuum evaporation, sputtering, and application of a liquid-phase silane compound, this method is advantageous in that the hydrophobic films 19, 25 having excellent coverage and having a film thickness on the order of nanometers can be formed easily.

In the element substrate 10 and the counter substrate 20, the hydrophobic films 19, 25 that overlap the sealant 40, the conductive member 60, and the ACF 70 are removed in the hydrophobic film removal step. Accordingly, the element substrate 10 and the counter substrate 20 can be reliably adhered to each other via the sealant 40 without being disrupted by the hydrophobic films 19, 25. In addition, the counter electrode 23 of the counter substrate 20 can be reliably connected to the connection portions 106a of the element substrate 10 via the conductive member 60. Moreover, the FPC 108 and the external connection terminals 104 can be reliably connected to each other via the ACF 70.

In the hydrophobic film removal step, irradiation with ultraviolet (UV) rays in ambient air (in an atmosphere containing oxygen) generates ozone, which decomposes the hydrophobic films 19, 25. In addition, irradiation with ultraviolet (UV) rays is carried out such that the contact angle at a film-removed portion becomes 30 degrees or less. Thus, compared with a case of removal by using a photoresist to cover the portions not to be removed in the hydrophobic films 19, 25 and by performing oxygen plasma treatment, the hydrophobic films 19, 25 can be removed selectively and reliably by using a simple method since this method does not require any step of patterning and removing any photoresist.

In the hydrophobic film removal step, the element substrate 10 (the mother substrate 10W) is irradiated with ultraviolet (UV) rays while using the mask 80 for exposure that has the first light-blocking patterns 81 and the second light-blocking patterns 82. The first light-blocking patterns 81 are disposed so as to cover the sealant-surrounded regions E2. The second light-blocking patterns 82 are disposed so as to cover the regions in which the data line driving circuits 101 of the element substrates 10 are formed. Thus, ultraviolet (UV) rays are not applied to the pixel circuit, the scanning line driving circuit 102, and the data line driving circuit 101 that are disposed in the sealant-surrounded region E2 of each element substrate 10. In other words, this can prevent transistors included in these circuits from having their properties changed due to irradiation with the ultraviolet (UV) rays.

The alignment film formation step, the hydrophobic film formation step, and the hydrophobic film removal step are carried out more efficiently by using the mother substrate compared with a case of carrying out these steps by using individual ones of the element substrates 10 and individual ones of the counter substrates 20.

Note that in the method of manufacturing the liquid crystal device 100, the sealant disposal step (step S4) and the conductive member disposal step (step S5) are not limited to being carried out on the element substrate 10. Step S4 and step S5 may be carried out on the counter substrate 20. Moreover, step S4 and step S5 may be carried out on the element substrate 10 and the counter substrate 20, respectively.

In the liquid crystal filling and substrate adhering step (step S6), it has been described that the mother substrate 10W for the element substrates 10 and the mother substrate 20W for the counter substrates 20 are adhered to each other. However, the liquid crystal filling and substrate adhering step (step S6) is not limited to this. Individual counter substrates 20 may be taken out first from the mother substrate 20W, and subsequently, the individual ones of the counter substrates 20 may be adhered to respective ones of the element substrates 10 that are arranged on the mother substrate 10W.

The method of filling liquid crystal into the space between the element substrates 10 and respective ones of the counter substrates 20 is not limited to the ODF method. For example, the element substrate 10 and the counter substrate 20 are first adhered to each other by the sealant 40, and a portion of the sealant 40 is cut open to form an injection port. Subsequently, liquid crystal is injected into the injection port under depressurized conditions after the air inside has been discharged. Finally, the injection port is sealed by a sealant. In other words, the liquid crystal panel is filled with liquid crystal by using vacuum injection.

Second Embodiment

Electronic Apparatus

Figure 17:
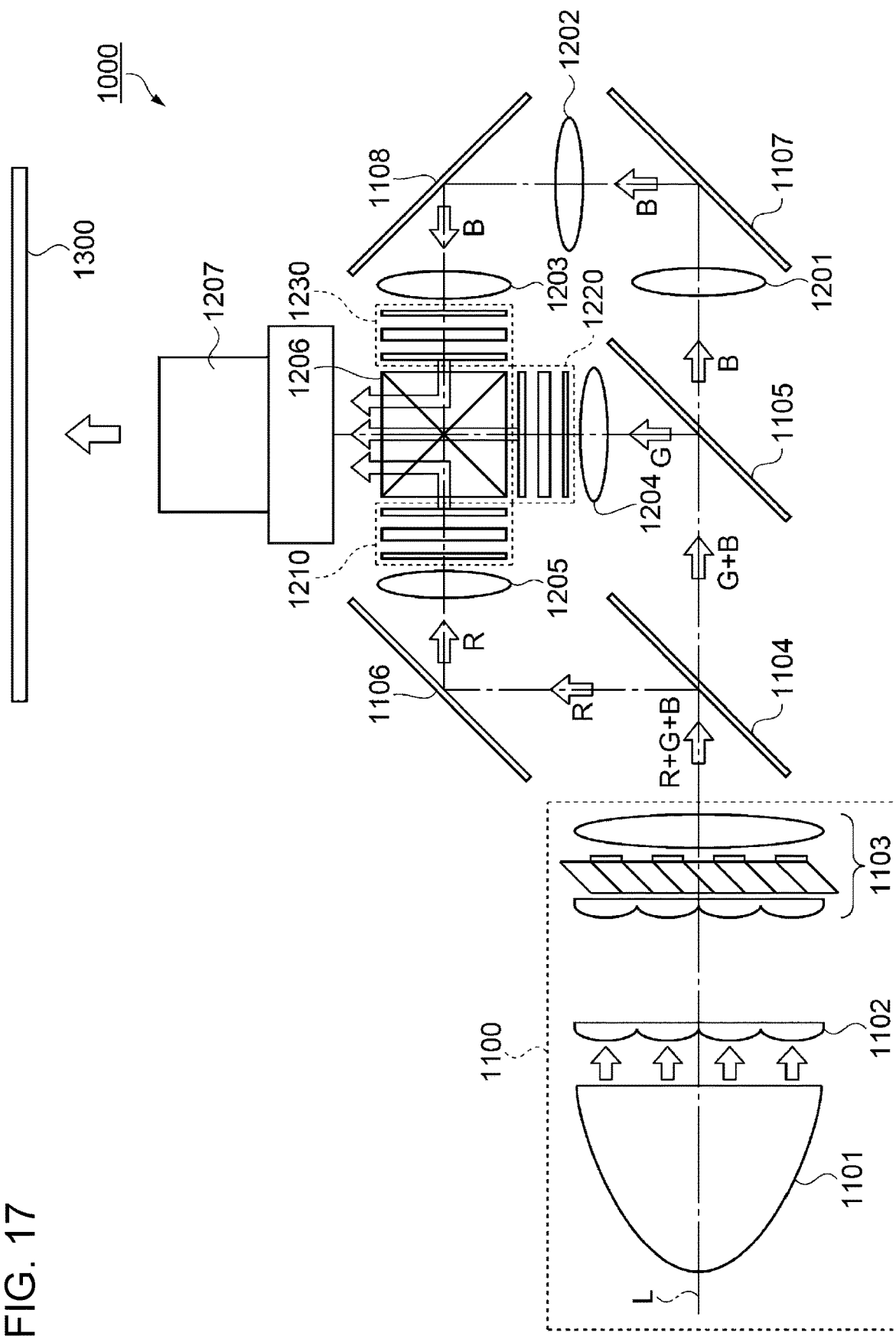
FIG. 17 is a view schematically illustrating a structure of a projection-type display apparatus, which is a type of electronic apparatus.

Next, a projection-type display apparatus will be described as an example of an electronic apparatus according to the embodiment. FIG. 17 is a view schematically illustrating a structure of a projection-type display apparatus as an electronic apparatus.

As illustrated in FIG. 17, a projection-type display apparatus 1000, which is an electronic apparatus according to the embodiment, includes a polarized illumination device 1100 disposed along the system optical axis L, two dichroic mirrors 1104, 1105 as light separation elements, three reflective mirrors 1106, 1107, 1108, five relay lenses 1201, 1202, 1203, 1204, 1205, three transmissive liquid crystal light valves 1210, 1220, 1230 as light modulators, a cross-dichroic prism 1206 as a light-combining element, and a projector lens 1207.

The polarized illumination device 1100 is mainly constituted by a lamp unit 1101 having a white-light source such as an ultra-high-pressure mercury lamp or a halogen lamp, an integrator lens 1102, and a polarization conversion element 1103.

Of polarized light emitted by the polarized illumination device 1100, the dichroic mirror 1104 reflects red light (R) and transmits green light (G) and blue light (B). The other dichroic mirror 1105 reflects green light (G) and transmits blue light (B), which are transmitted by the dichroic mirror 1104.

Red light (R) reflected by the dichroic mirror 1104 is further reflected by the reflective mirror 1106 and consequently is incident on the liquid crystal light valve 1210 via the relay lens 1205. Green light (G) reflected by the dichroic mirror 1105 is incident on the liquid crystal light valve 1220 via the relay lens 1204. Blue light (B) transmitted by the dichroic mirror 1105 is incident on the liquid crystal light valve 1230 via a light guiding system constituted by three relay lenses 1201, 1202, 1203 and two reflective mirrors 1107, 1108.

The liquid crystal light valves 1210, 1220, 1230 are disposed so as to face respective incident surfaces of the cross-dichroic prism 1206 corresponding to the color lights. The color lights incident on corresponding ones of the liquid crystal light valves 1210, 1220, 1230 are modulated in accordance with image information (image signals) and emitted toward the cross-dichroic prism 1206. The cross-dichroic prism 1206 is composed of four right-angled prisms bonded together. Inside the cross-dichroic prism 1206, a dielectric multilayer that reflects red light and a dielectric multilayer that reflects blue light are formed in a crosswise manner. These dielectric multilayers combine three color lights to generate light representing a color image. Combined light is projected onto a screen 1300 by a projector lens 1207, which is a projection optical system, so that an image is enlarged and displayed on the screen 1300.

According to the projection-type display apparatus 1000, the foregoing liquid crystal devices 100 are used as the liquid crystal light valves 1210, 1220, 1230. In the liquid crystal device 100, photochemical reactions between the alignment films 18, 24, which are inorganic alignment films, and liquid crystal molecules LC are suppressed. Thus, the liquid crystal device 100 can provide a stable image display quality for a long period of time. In addition, the hydrophobic films 19, 25, which covers respective ones of the alignment films 18, 24, are removed from regions that overlap the sealant 40, the conductive member 60, and the ACF 70 so that the adhering ability of the sealant 40 and the conductivity of the conductive member 60 and the ACF 70 are reliably maintained. In other words, a projection-type display apparatus 1000 with high reliability can be provided.

The invention is not limited to the embodiments described above and can be appropriately modified without departing from the gist or spirit of the invention that can be read from the claims and the entire specification. Even when the method of manufacturing the liquid crystal device and the electronic apparatus to which the liquid crystal device is modified in such a manner, the modified method is also included in the technical scope of the invention. Various modifications other than the foregoing embodiment are conceivable. Modification examples will be described below.

Modification Example 1

In the method of manufacturing the liquid crystal device 100, the hydrophobic film removal step is not limited to removing the hydrophobic films from the regions outside the pixel region E1 on both the element substrate 10 and the counter substrate 20. In the method of manufacturing the liquid crystal device 100, the sealant 40 and the conductive member 60 are disposed on the element substrate 10. Thus, the hydrophobic film removal step may be carried out on the element substrate 10. When structures such as the sealant 40 and the conductive member 60 are disposed on the counter substrate 20, the hydrophobic film removal step may be carried out on the counter substrate 20. In other words, in at least one of the element substrate 10 and the counter substrate 20 on which the structures such as the sealant 40 and the conductive member 60 are disposed, the hydrophobic film may be removed from regions that overlap such structures. Incidentally, the hydrophobic film 19 formed on the terminal section 10*a* of the element substrate 10 to which the ACF 70 is transferred can be removed by oxygen plasma treatment without masking after the liquid crystal panel 110 is completed.

Modification Example 2

The method of forming the hydrophobic films 19, 25 is not limited to the method using a silane compound (silane coupling agent). For example, the hydrophobic films 19, 25 can be also formed by applying an alcohol such as isopropanol on the surface of the inorganic alignment film and by drying the surface. Silanol groups on the surface of the inorganic alignment film are substituted by alkyl groups of the alcohol.

Modification Example 3

The liquid crystal device to which the method of manufacturing the liquid crystal device 100 according to the invention is applied is not limited to the transmissive type liquid crystal device. However, the method can be applied to a reflective type liquid crystal device in which the pixel electrode 15 is formed of a light reflective conductive film.

Modification Example 4

The electronic apparatus to which the liquid crystal device 100 according to the first embodiment can be applied is not limited to the projection-type display apparatus 1000 according to the second embodiment. For example, by disposing a color filter in which each pixel has a pigmented layer, the liquid crystal device can be preferably used as a display unit for an information terminal, such as a projection-type head-up display (HUD), a direct-view type head mounted display (HMD), an electronic book, a personal computer, a digital still camera, a LCD television, a viewfinder-type video recorder or a direct-view monitor-type video recorder, a car navigation system, an electronic organizer, and a POS.

The entire disclosure of Japanese Patent Application No. 2017-106271, filed May 30, 2017 is expressly incorporated by reference herein.

What is claimed is:

1. A method of manufacturing a liquid crystal device that comprises an element substrate that has a connection portion and a connection terminal, a counter substrate that comprises a counter electrode that is electrically connected to the connection portion via a conductive member, and a sealant interposed between the element substrate and the counter substrate, the method comprising:
    forming an inorganic alignment film on a side of the element substrate that faces a liquid crystal layer and on a side of the counter substrate that faces the liquid crystal layer;
    forming a hydrophobic film that covers the inorganic alignment film; and
    removing the hydrophobic film on a portion that overlaps the connection portion, the connection terminal, and the sealant when viewed in plan view,
    wherein the element substrate comprises a scanning line driving circuit that is disposed along an inside edge of the sealant and a data line driving circuit that is disposed along an outside edge of the sealant, and
    in the removing, a region in which the scanning line driving circuit is disposed when viewed in plan view is masked by a first light-blocking portion, a region in which the data line driving circuit is disposed when viewed in plan view is masked by a second light-blocking portion, and irradiated with ultraviolet rays.

2. The method of manufacturing the liquid crystal device according to claim 1, wherein
    the counter electrode of the counter substrate is disposed so as to oppose the plurality of the pixel electrodes via the sealant,
    the element substrate has a connection portion at a position outside the pixel region, the connection portion being electrically connected to the counter electrode via a conductive member, and
    in the removing, the hydrophobic film on the portion that overlaps the connection portion when viewed in plan view is removed from the element substrate and the counter substrate.

3. The method of manufacturing the liquid crystal device according to claim 1, wherein
    the element substrate and the counter substrate are adhered to each other via the sealant, and the sealant is disposed outside the pixel region, and
    in the removing, the hydrophobic film on a portion that overlaps the sealant when viewed in plan view is removed from the element substrate and from the counter substrate.

4. The method of manufacturing the liquid crystal device according to claim 1, wherein
    the element substrate has a plurality of external connection terminals disposed outside the pixel region, and
    in the removing, the hydrophobic film on a portion that overlaps a region including the external connection terminals when viewed in plan view is removed.

5. The method of manufacturing the liquid crystal device according to claim 1, wherein
    the counter electrode of the counter substrate is disposed so as to oppose the plurality of the pixel electrodes via the sealant,
    the element substrate further comprises a plurality of external connection terminals, wherein the connection portion of the element substrate and the plurality of external connection terminals are at positions outside the pixel region,
    the element substrate and the counter substrate are adhered to each other via the sealant, and the sealant is disposed outside the pixel region, and
    in the removing, portions of the hydrophobic film that overlap respective regions that include the connection portion, the sealant, and the plurality of the external connection terminals when viewed in plan view are removed.

6. The method of manufacturing the liquid crystal device according to claim 1, wherein
    in the forming of the hydrophobic film, the hydrophobic film is formed by exposing each of the element substrate and the counter substrate on both of which the inorganic alignment film has been formed to a gas atmosphere containing a silane compound having a hydrophobic group.

7. The method of manufacturing the liquid crystal device according to claim 1, wherein
    in the removing, the hydrophobic film is removed in such a manner that at least the pixel region of at least one of the element substrate and the counter substrate is masked and the hydrophobic film is irradiated with ultraviolet rays in an atmosphere containing oxygen.

8. The method of manufacturing the liquid crystal device according to claim 7, wherein
    the element substrate further comprises a pixel circuit that performs switching control of each of the plurality of the pixel electrodes and a peripheral circuit that drives the pixel circuit, and
    in the removing, a region in which the peripheral circuit is disposed when viewed in plan view is masked and irradiated with ultraviolet rays.

9. The method of manufacturing the liquid crystal device according to claim 1, wherein
    in the forming of the hydrophobic film, the hydrophobic film is formed in such a manner that the hydrophobic film has a water contact angle of 40 degrees or more when measured in accordance with a static method, and
    in the removing, the hydrophobic film is irradiated with ultraviolet rays in such a manner that a surface from which the hydrophobic film has been removed has a water contact angle of 30 degrees or less when measured in accordance with the static method.

10. The method of manufacturing the liquid crystal device according to claim 1, wherein
    at least the element substrate, of the element substrate and the counter substrate, is manufactured from a mother substrate in such a manner that a plurality of element substrates are arranged on the mother substrate, and
    at least the removing is carried out by using the mother substrate.

11. A liquid crystal device, manufactured by employing the method of manufacturing the liquid crystal device according to claim 1.

12. An electronic apparatus comprising the liquid crystal device according to claim 11.

13. A liquid crystal device, manufactured by employing the method of manufacturing the liquid crystal device according to claim 2.

14. An electronic apparatus comprising the liquid crystal device according to claim 13.

15. A liquid crystal device, manufactured by employing the method of manufacturing the liquid crystal device according to claim 3.

16. An electronic apparatus comprising the liquid crystal device according to claim 15.

17. A liquid crystal device, manufactured by employing the method of manufacturing the liquid crystal device according to claim 4.

18. An electronic apparatus comprising the liquid crystal device according to claim 17.

19. A liquid crystal device, manufactured by employing the method of manufacturing the liquid crystal device according to claim 5.

20. An electronic apparatus comprising the liquid crystal device according to claim 19.

* * * * *